US009217930B2

(12) United States Patent
Wangler et al.

(10) Patent No.: US 9,217,930 B2
(45) Date of Patent: Dec. 22, 2015

(54) ILLUMINATION SYSTEM FOR A MICROLITHOGRAPHIC PROJECTION EXPOSURE APPARATUS

(71) Applicant: Carl Zeiss SMT GmbH, Oberkochen (DE)

(72) Inventors: Johannes Wangler, Koenigsbronn (DE); Heiko Siekmann, Aalen (DE); Kenneth Weible, Neuchatel (CH); Ralf Scharnweber, Aalen (DE); Manfred Maul, Aalen (DE); Markus Deguenther, Aalen (DE); Michael Layh, Altusried (DE); Axel Scholz, Aalen (DE); Uwe Spengler, Treuchtlingen (DE); Reinhard Voelkel, Neuchatel (CH)

(73) Assignee: Carl Zeiss SMT GmbH, Oberkochen (DE)

( * ) Notice: Subject to any disclaimer, the term of this patent is extended or adjusted under 35 U.S.C. 154(b) by 365 days.

(21) Appl. No.: 13/760,268

(22) Filed: Feb. 6, 2013

(65) Prior Publication Data
US 2013/0148092 A1 Jun. 13, 2013

Related U.S. Application Data

(63) Continuation of application No. 12/190,308, filed on Aug. 12, 2008, now Pat. No. 8,395,756, which is a continuation of application No. PCT/EP2007/001267, filed on Feb. 14, 2007.

(60) Provisional application No. 60/774,850, filed on Feb. 17, 2006.

(51) Int. Cl.
*G02B 27/10* (2006.01)
*G03B 27/32* (2006.01)
(Continued)

(52) U.S. Cl.
CPC ........ *G03F 7/70058* (2013.01); *G03F 7/70075* (2013.01); *G03F 7/70083* (2013.01); *G03F 7/70158* (2013.01)

(58) Field of Classification Search
CPC .... G02B 3/0043; G02B 3/005; G02B 3/0056; G02B 27/0961; G02B 27/0966; G03F 7/70058; G03F 7/70075; G03F 7/70083; G03F 7/70158
USPC .......... 355/53, 67, 71, 77; 359/619, 621–624, 359/626, 628
See application file for complete search history.

(56) References Cited

U.S. PATENT DOCUMENTS 4,682,885 A 7/1987 Torigoe
5,119,235 A 6/1992 Umeda et al.
(Continued)

FOREIGN PATENT DOCUMENTS

CN 2725938 9/2005
EP 0 468 328 A1 1/1992
(Continued)

OTHER PUBLICATIONS

English translation and Chinese Office Action for Chinese Application No. 200780005542.6, dated May 18, 2011.
(Continued)

*Primary Examiner* — Colin Kreutzer
(74) *Attorney, Agent, or Firm* — Fish & Richardson P.C.

(57) ABSTRACT

Illumination systems for microlithographic projection exposure apparatus, as well as related systems, components and methods are disclosed. In some embodiments, an illumination system includes one or more scattering structures and an optical integrator that produces a plurality of secondary light sources.

25 Claims, 26 Drawing Sheets

(51) Int. Cl.
*G03B 27/42* (2006.01)
*G03B 27/54* (2006.01)
*G03B 27/72* (2006.01)
*G03F 7/20* (2006.01)

(56) References Cited

U.S. PATENT DOCUMENTS

| | | | |
|---|---|---|---|
| 5,229,872 | A | 7/1993 | Mumola |
| 5,296,891 | A | 3/1994 | Vogt et al. |
| 5,523,193 | A | 6/1996 | Nelson |
| 5,815,248 | A | 9/1998 | Nishi |
| 5,847,746 | A | 12/1998 | Takahashi |
| 5,963,305 | A | 10/1999 | Mizouchi |
| 6,243,206 | B1 | 6/2001 | Wangler |
| 6,259,561 | B1 | 7/2001 | George et al. |
| 6,416,237 | B2 | 7/2002 | Lissotschenko et al. |
| 6,583,937 | B1 | 6/2003 | Wangler et al. |
| 6,738,129 | B2 | 5/2004 | Mizouchi |
| 6,816,234 | B2 | 11/2004 | Tsuji |
| 2002/0030890 | A1 | 3/2002 | Kato et al. |
| 2002/0036763 | A1 | 3/2002 | Krikke et al. |
| 2004/0036977 | A1 | 2/2004 | Tanaka et al. |
| 2004/0105170 | A1 | 6/2004 | Krahmer et al. |
| 2005/0018294 | A1 | 1/2005 | Hauschild |
| 2005/0140860 | A1 | 6/2005 | Olczak |
| 2007/0024836 | A1 | 2/2007 | Singer et al. |
| 2007/0217013 | A1 | 9/2007 | Schuster et al. |
| 2009/0021839 | A1 | 1/2009 | Wolf et al. |

FOREIGN PATENT DOCUMENTS

| | | |
|---|---|---|
| EP | 0 576 297 A1 | 12/1993 |
| EP | 0 921 418 A2 | 6/1999 |
| EP | 0 952 491 | 10/1999 |
| JP | 06-084759 | 3/1994 |
| JP | 2003-090959 | 3/2003 |
| WO | 2003/026846 | 4/2003 |
| WO | 2005/076083 | 8/2005 |
| WO | 2005/078522 | 8/2005 |
| WO | 2007/093396 | 8/2007 |
| WO | 2007/093433 | 8/2007 |

OTHER PUBLICATIONS

Japanese Office Action, with English translation, for corresponding JP Application No. 2008-554668, dated Apr. 18, 2011.

Arnold et al., "Machinability Studies of Infrared Window Materials and Metals," SPIE vol. 93, Advances in Precision Machining of Optics (1976), 96-103.

Decker et al., "Optical and Surface Physical Characteristics of Diamond-machined Infrared Window Materials," NBS Special Publication 568, Laser Induced Damage in Optical Materials: (1979), 199-208.

Fang et al., "Burr Formation in Fly-cutting," www.simtech.a-star.edu.sg/research/technicalreports/tr0311.pdf on Jan. 29, 2007.

Flamm et al., "Fabrication of Microlens Arrays in CaF2 by Ion Milling," Micromachining Technologies for Micro Optics, Proceeding SPIE vol. 4179 (2000), 108-116.

Hockey and Rice, Editors, "The Science of Ceramic Machining and Surface Finishing II," Proceedings of a Symposium held at the National Bureau of Standards, Nov. 13-15, 1978, NBS Special Publication 562, (1979), 293 to 304.

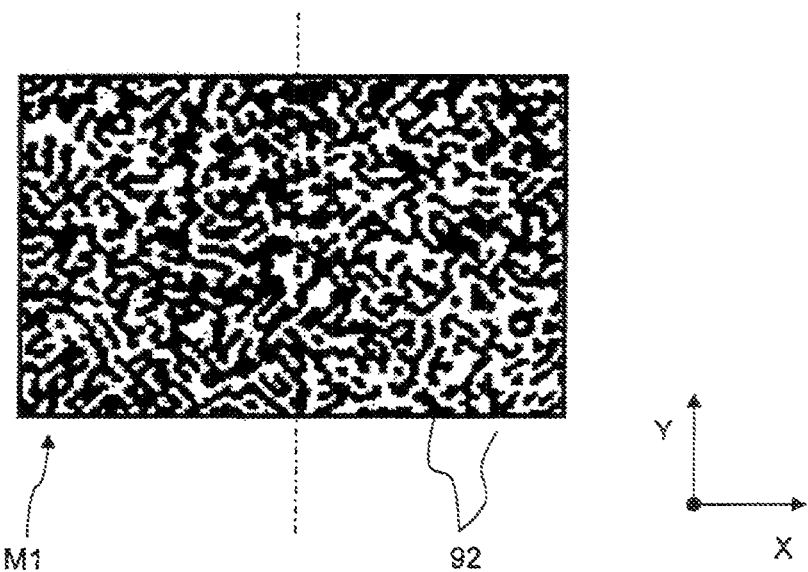
Fig. 37
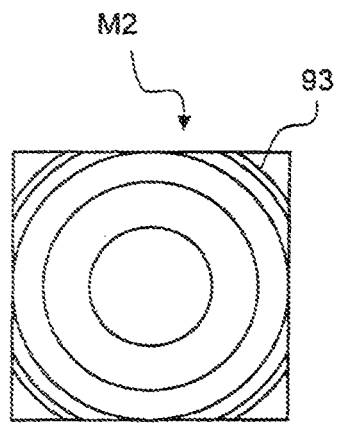 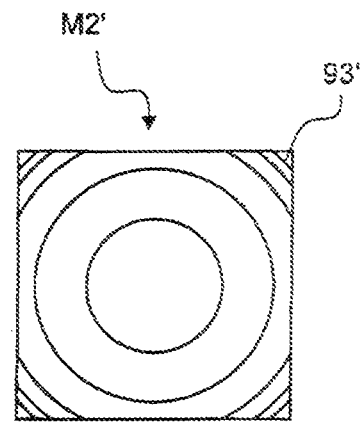
Fig. 38a         Fig. 38b

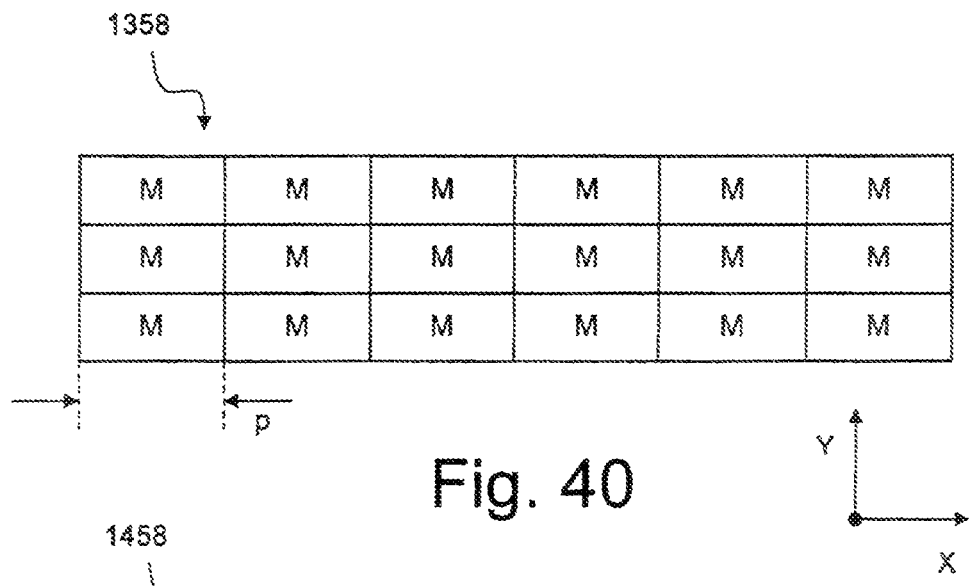
Fig. 40
Fig. 41
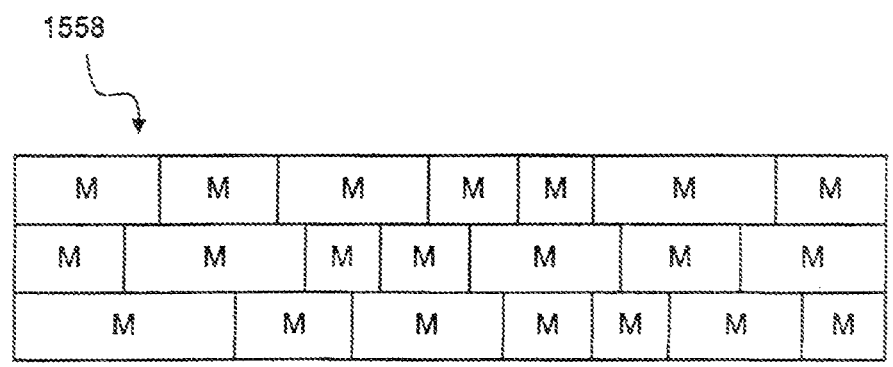
Fig. 42

ILLUMINATION SYSTEM FOR A MICROLITHOGRAPHIC PROJECTION EXPOSURE APPARATUS

CROSS-REFERENCE TO RELATED APPLICATIONS

The present application is a continuation U.S. patent application Ser. No. 12/190,308 filed Aug. 12, 2008, which is a continuation of international patent application serial number PCT/EP2007/001267 filed Feb. 14, 2007, which claims benefit of U.S. provisional patent application Ser. No. 60/774,850 filed Feb. 17, 2006. The full disclosure of each prior application is incorporated herein by reference.

FIELD

The disclosure relates generally to illumination systems for microlithographic projection exposure apparatus, as well as related systems, components and methods. In some embodiments, an illumination system includes one or more scattering structures and an optical integrator that produces a plurality of secondary light sources.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multilayered microstructured component.

A projection exposure apparatus typically includes an illumination system, a mask stage for a aligning the mask, a projection lens and a wafer alignment stage for aligning the wafer coated with the photoresist. The illumination system illuminates a field on the mask that often has the shape of an (elongated) rectangle or a ring segment.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification of the projection lens, which is usually smaller than 1, for example 1:4.

It is to be understood that the term "mask" (or reticle) is to be interpreted broadly as a patterning device. Commonly used masks contain transmissive or reflective patterns and may be of the binary, alternating phase-shift, attenuated phase-shift or various hybrid mask type, for example. However, there are also active masks, e.g. masks realized as a programmable mirror array. An example of such a device is a matrix-addressable surface having a viscoelastic control layer and a reflective surface. More information on such mirror arrays can be gleaned, for example, from U.S. Pat. No. 5,296,891 and U.S. Pat. No. 5,523,193. Also programmable LCD arrays may be used as active masks, as is described in U.S. Pat. No. 5,229,872. For the sake of simplicity, the rest of this text may specifically relate to apparatus including a mask and a mask stage; however, the general principles discussed in such apparatus should be seen in the broader context of the patterning devices as noted above.

The angular distribution of the projection light impinging on the mask is usually adapted to the kind of pattern to be projected onto the photoresist. For example, relatively large sized features may involve a different angular distribution than small sized features. Commonly used angular distributions of projection light are referred to as conventional, annular, dipole and quadrupole illumination settings. These terms refer to the irradiance distribution in a pupil plane of the illumination system. With an annular illumination setting, for example, only an annular region is illuminated in the pupil plane, and thus there is only a small range of angles present in the angular distribution of the projection light so that all light beams impinge obliquely with similar angles onto the mask.

In illumination systems designed for wavelengths below 200 nm, lasers are typically used as light sources. The projection light bundle emitted by a laser typically has a small cross section and a low divergence, and therefore also the geometrical optical flux is small. The geometrical optical flux, which is also referred to as the Lagrange invariant, is a quantity that is, at least for certain special configurations, proportional to the product of maximum light angle and size of the illuminated field.

SUMMARY

In some embodiments, the disclosure provides an illumination system for a microlithographic projection exposure apparatus that makes it possible to achieve a desired irradiance and angular distribution in a mask plane. A uniform or desired nonuniform irradiance distribution can be achieved that is substantially independent from the illumination setting.

In certain embodiments, an illumination system includes a light source and an optical integrator. The optical integrator includes first optical subelements and produces a plurality of secondary light sources each emitting a light bundle. The condenser effects a superposition of the light bundles in a mask plane. At least one scattering structure is provided that includes a plurality of second optical subelements that are arranged in front of or behind the secondary light sources. The first and second optical subelements are configured such that optical subelements illuminated with identical irradiance distributions are separated by more than 5 mm.

This configuration can reduce undesired interactions between the at least one scattering structure and the optical integrator that may result in fluctuations in the irradiance distribution obtained in a mask plane of the illumination system.

In some embodiments, an illumination system includes an optical integrator and at least one scattering structure. The latter has a plurality of subelements that produce rectangular angular distributions having different angular widths.

Such a scattering structure can produce a Gaussian angular distribution having a half value width that may be easily defined by selecting substructures producing angular distributions having appropriate angular widths. Such a scattering structure may be advantageously arranged between the optical integrator and a condenser that superposes secondary light sources produced by the optical integrator.

In some embodiments, an illumination system includes a light source and an optical integrator producing secondary light sources. A first scattering structure produces a substantially rectangular angular distribution in one direction. A second scattering structure produces a substantially Gaussian angular distribution in two orthogonal directions. Such an illumination system can be particularly suitable for producing slit-shaped illuminated fields that are involved for projection exposure apparatus of the step-and-scan type.

BRIEF DESCRIPTION OF THE DRAWINGS

Various features and advantages of the present disclosure may be more readily understood with reference to the following detailed description taken in conjunction with the accompanying drawing in which:

FIG. 37 is a top view on a diffractive cell for use in the first scattering plate;

FIGS. 38a and 38b are schematic top views on diffractive cells forming Fresnel lenses having different curvatures;

FIGS. 40 to 43 are schematic top views on cell arrangements for the first scattering plate;

DETAILED DESCRIPTION

1. General Structure of Projection Exposure Apparatus

Figure 1:
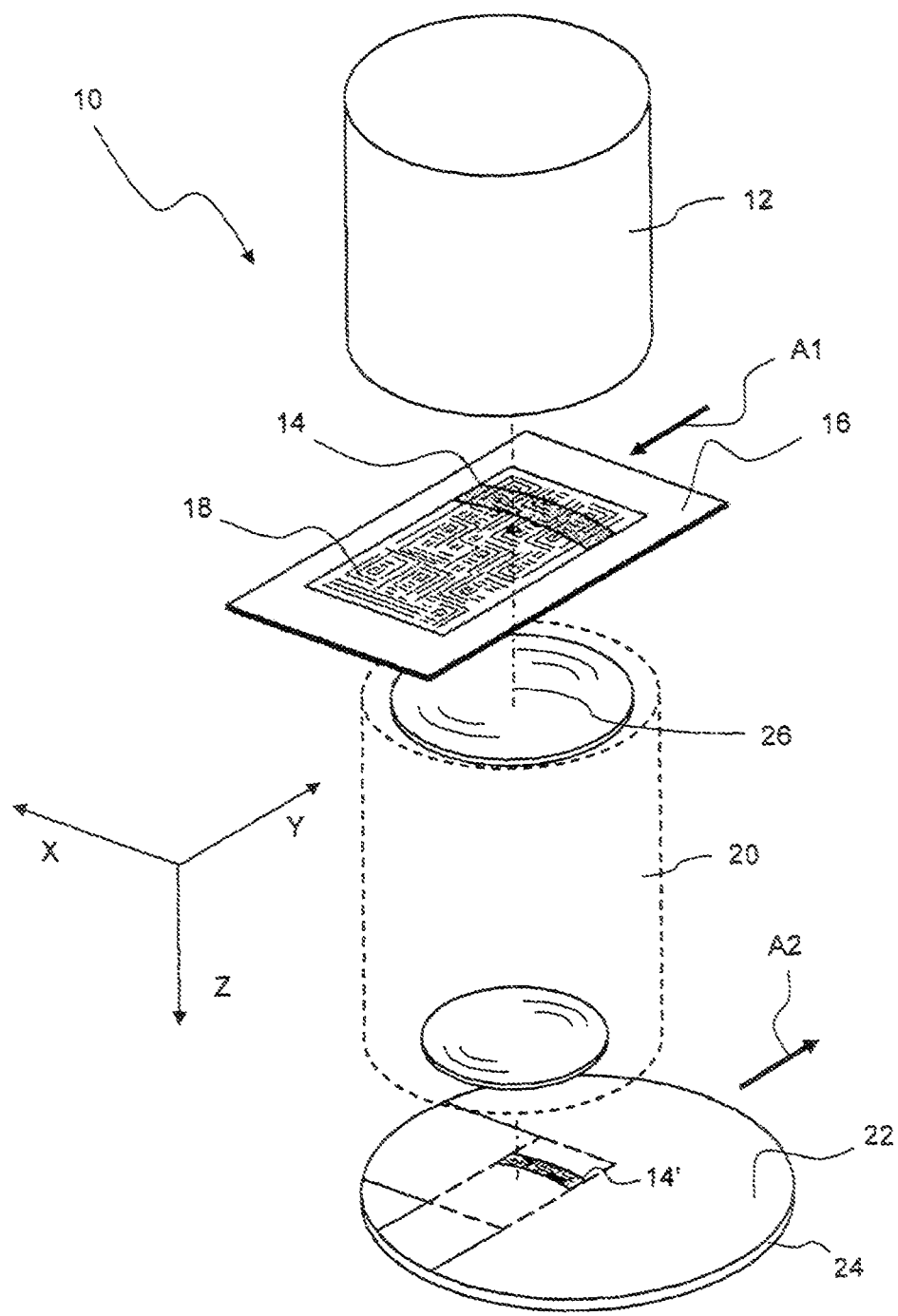
FIG. 1 is a perspective and considerably simplified view of a projection exposure apparatus.

FIG. 1 shows a perspective and highly simplified view of a projection exposure apparatus 10 that includes an illumination system 12 for producing a projection light bundle. The projection light bundle illuminates a field 14 on a mask 16 containing minute structures 18. The illuminated field 14 has approximately the shape of a ring segment. However, other, for example rectangular, shapes of the illuminated field 14 are contemplated as well.

A projection objective 20 images the structures 18 within the illuminated field 14 onto a light sensitive layer 22, for example a photoresist, which is deposited on a substrate 24. The substrate 24, which may formed by a silicon wafer, is arranged on a wafer stage (not shown) such that a top surface of the light sensitive layer 22 is precisely located in an image plane of the projection objective 20. The mask 16 is positioned by a mask stage (not shown) in an object plane of the projection objective 20. Since the latter has a magnification of less than 1, a minified image 14' of the structures 18 within the illuminated field 14 is projected onto the light sensitive layer 22.

During the projection, the mask 16 and the substrate 24 move along a scan direction which coincides with the Y direction. Thus the illuminated field 14 scans over the mask 16 so that structured areas larger than the illuminated field 14 can be continuously projected. Such a type of projection exposure apparatus is often referred to as "step-and-scan tool" or simply a "scanner". The ratio between the velocities of the mask 16 and the substrate 24 is equal to the magnification of the projection objective 20. If the projection objective 20 inverts the image, the mask 16 and the substrate 24 move in opposite directions, as this is indicated in FIG. 1 by arrows A1 and A2. However, the present disclosure may also be used in stepper tools in which the mask 16 and the substrate 24 do not move during projection.

The illuminated field 14 is not centered with respect to an optical axis 26 of the projection objective 20. Such an off-axis illuminated field 14 may be involved with certain types of projection objectives 20, for example objectives that contain one or more truncated mirrors. As a matter of course, the present disclosure may also be employed in illumination systems with a centered illuminated field.

2. General Structure of Illumination System

Figure 2:
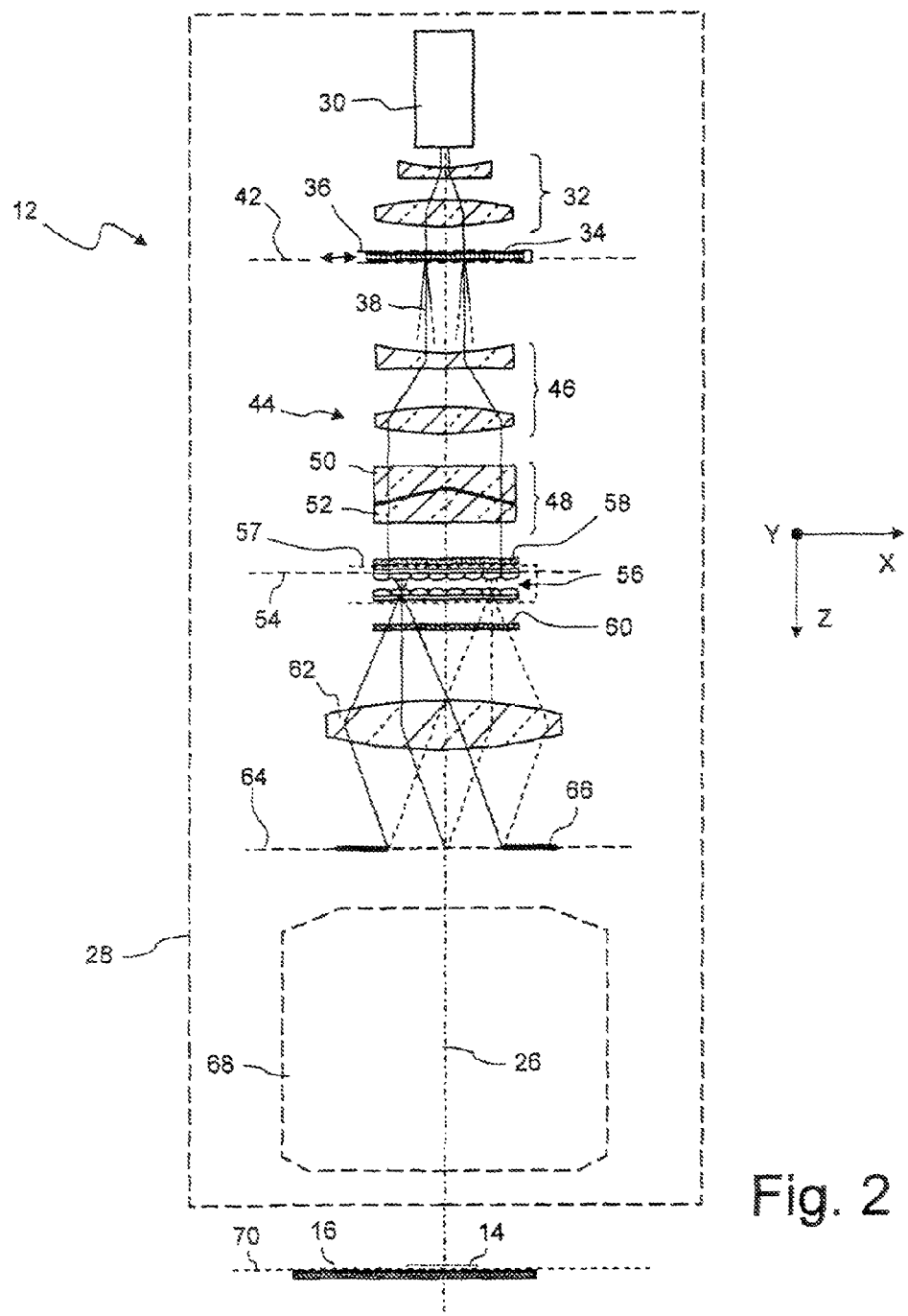
FIG. 2 is a meridional section through an illumination system contained in the projection exposure apparatus shown in FIG. 1.

FIG. 2 is a more detailed meridional section through the illumination system 12 shown in FIG. 1. For the sake of clarity, the illustration of FIG. 2 is also considerably simplified and not to scale. This particularly implies that different optical units are represented by very few optical elements only. In reality, these units may include significantly more lenses and other optical elements.

The illumination system 12 includes a housing 28 and a light source that can be an excimer laser 30. The excimer laser 30 emits projection light that has a wavelength of about 193 nm.

Other types of light sources and other wavelengths, for example 248 nm or 157 nm, are also contemplated.

The projection light emitted by the excimer laser 30 enters a beam expansion unit 32 in which the light bundle is expanded. After passing through the beam expansion unit 32, the projection light impinges on a first optical raster element 34. The first optical raster element 34 is received in a first exchange holder 36 so that it can easily be removed or replaced by other optical raster elements having different properties. The first optical raster element 34 includes one or more diffraction gratings that deflect each incident ray such that a divergence is introduced. This means that at each location on the optical raster element 34, light is diffracted within a certain range of angles. This range may extend, for example, from −3° to +3°. In FIG. 2 this is schematically represented for two off-axis rays 38a, 38b that are split into a plurality of diverging rays 38. The first optical raster element 34 thus slightly increases the geometrical optical flux and modifies the local irradiance distribution in a subsequent pupil plane. Other kinds of optical raster elements, for example microlens arrays or an array of phase step or grey-tone Fresnel lenses, may be used instead or additionally.

The first optical raster element 34 is positioned in an object plane 42 of an objective 44 that includes a zoom lens group 46 and a pair 48 of axicon elements 50, 52 having opposing conical faces. If both axicon elements 50, 52 are in contact, as is shown in FIG. 2, the axicon pair 48 has the effect of a plate having parallel plane surfaces. If both elements 50, 52 are moved apart, the spacing between the axicon elements 50, 52 results in a shift of light energy radially outward. Since axicon elements are known as such in the art, these will not be explained here in further detail.

Figure 3:
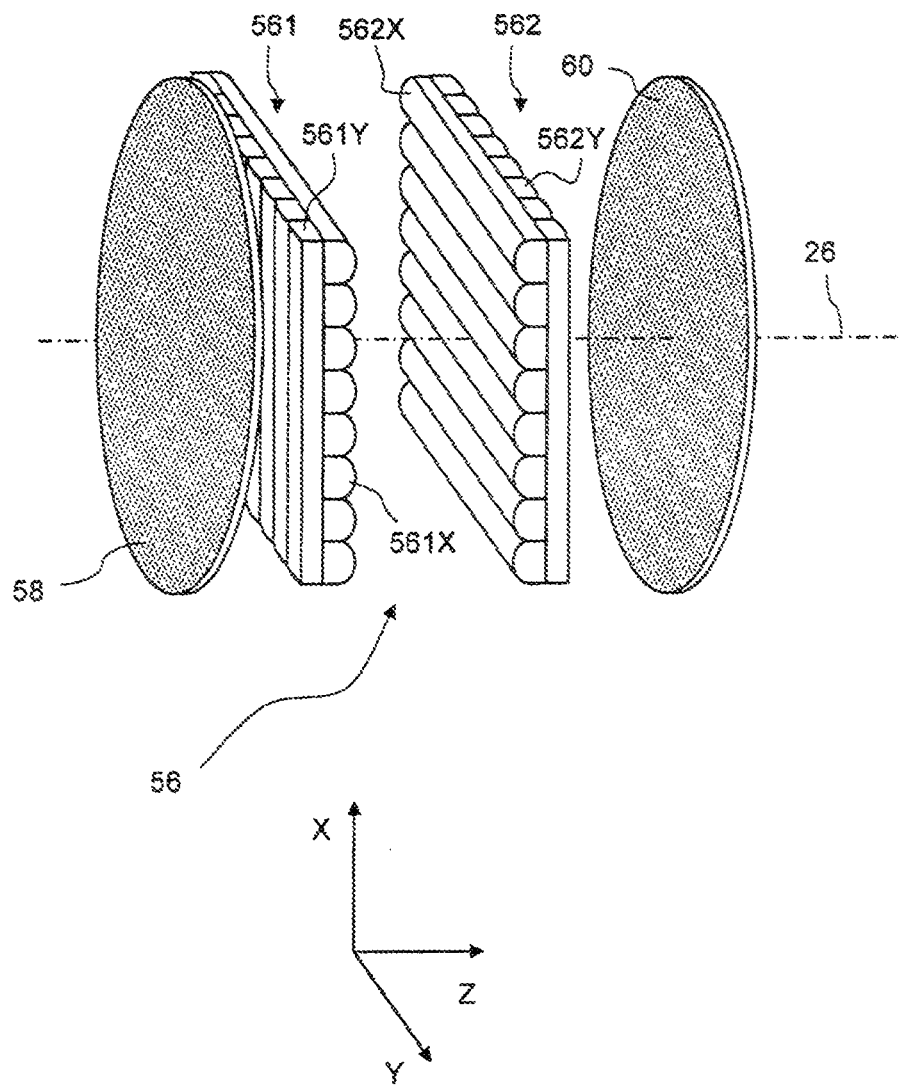
FIG. 3 is a perspective view of an optical integrator and two scattering plates contained in the illumination system shown in FIG. 2.
Figure 4:
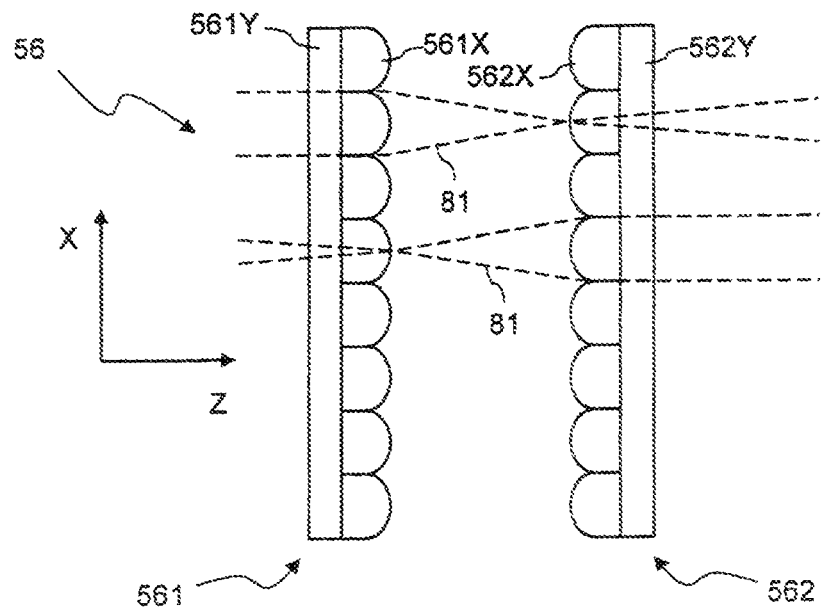
FIG. 4 is a section through the optical integrator shown in FIG. 3 parallel to an X-Z plane.
Figure 5:
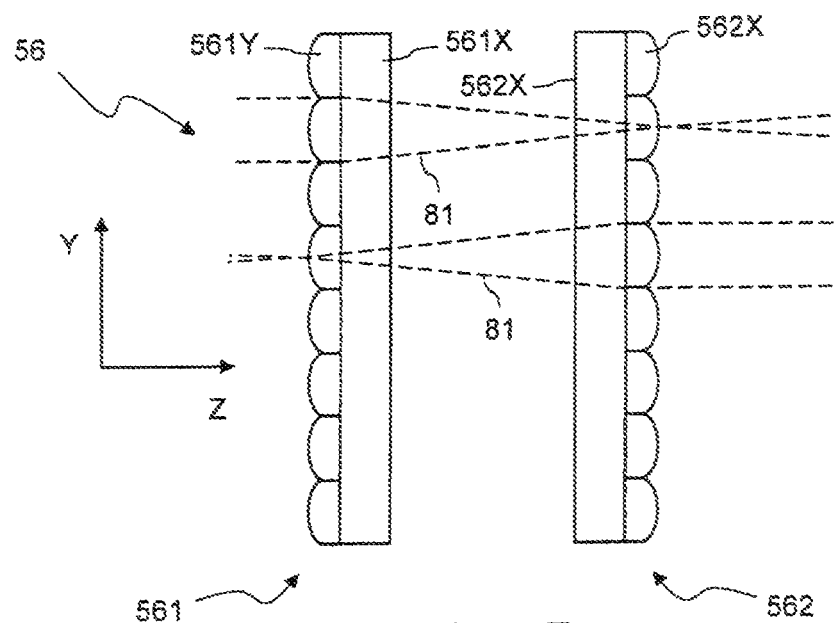
FIG. 5 is a section through the optical integrator shown in FIG. 3 parallel to a Y-Z plane.

Reference numeral 54 denotes an exit pupil plane of the objective 44. An optical integrator, which is denoted in its entirety by 56 and will be explained in more detail below with reference to FIGS. 3 to 5, is positioned in or in close proximity to the exit pupil plane 54 of the objective 44. The optical integrator 56, which is received in an exchange holder 57, modifies the angular distribution in the pupil plane 54. Since all light rays passing the pupil plane under the same angle converge to a single point in a subsequent Fourier related field plane, the angular distribution in the pupil plane 54 directly translates into an irradiance distribution in such a field plane. Thus the design of the optical integrator 56 has a strong influence on the irradiance distribution and the geometry of the illuminated field 14 on the mask 16. If the illuminated field 14 has the shape of a curved slit as is shown in FIG. 1, the exit side numerical aperture of the optical integrator 56 may, as a non-limiting example, be in the range from 0.28 to 0.35 in the X direction and in the range from 0.07 to 0.09 in the Y direction. The optical integrator produces a plurality of secondary light sources that each emits a light bundle.

In front of and behind the optical integrator 56 scattering plates are arranged that are denoted by 58 and 60, respectively, and whose structure and function will be elucidated further below.

The projection light emerging from the secondary light sources enters a condenser 62 that is represented in FIG. 2 by a single lens element for the sake of simplicity. The entrance pupil plane of the condenser 62 coincides with the exit pupil plane 54 of the objective 44. The condenser 62 superposes the light bundles emitted by the secondary light sources in a field stop plane 64 of the condenser 62 in which a field stop 66 is positioned. A field stop objective 68 images the field stop 66 onto a mask plane 70 in which the mask 16 is positioned. The field stop 66 ensures sharp edges of the illuminated field 14 at least for the short lateral sides extending along the Y direction. The field stop may be realized, for example, by two orthogonal pairs of blades. However, the (additional) use of an adjustable stop device as is disclosed in EP 0 952 491 A2 is also possible.

3. Optical Integrator

In the following the general structure and the function of the optical integrator 56 used in the illumination system 12 will be described in more detail with reference to FIGS. 3 to 5. FIG. 3 shows the optical integrator 56 and the scattering plates in a perspective view, and FIGS. 4 and 5 show the optical integrator 56 in sections parallel to the X-Z plane and the Y-Z plane, respectively.

3.1 General Structure of Optical Integrator

The optical integrator 56, which is known as such from International Application WO 2005/078522 A2 assigned to the applicant, includes a first integrator member 561 and a second integrator member 562. The first integrator member 561 includes a first array of cylindrical microlenses 561Y having parallel longitudinal axes that are aligned along the X direction. Thus the first microlenses 561Y have a positive refractive power only in the Y direction with a back focal length $f_1$.

The first integrator member 561 further includes an array of second cylindrical microlenses 561X that have parallel longitudinal axes aligned along the Y direction. The second microlenses 561X have a positive refractive power only in the X direction with a back focal length $f_2 < f_1$.

The second integrator member 562 is an identical copy of the first integrator member 561, but is mounted after a rotation by 180° around either the X or Y axis. Thus third microlenses 562X are facing the second microlenses 561X, and fourth microlenses 562Y are facing the second scattering plate 60.

As can be seen in FIGS. 4 and 5, the focal lengths $f_1$ and $f_2$ and the distance between the integrator members 561, 562 are selected such that focal lines produced by the second microlenses 561X are located on the vertices of the third microlenses 562X. Since the third microlenses 562X have the same focal length $f_2$ as the second microlenses 561X, this implies that the focal lines of the third microlenses 562X are located on the vertices of the second microlenses 561X. In FIG. 4 this mutual correspondence is illustrated by rays 81 drawn in broken lines.

From FIG. 5 it becomes clear that the same conditions also apply to the first and fourth microlenses 561Y, 562Y, respectively, having equal focal lengths $f_1$. Since the focal lines are located on the curved surfaces of the third and fourth microlenses 562X, 562Y and not inside these microlenses, very high light intensities that could destroy the material of the microlenses or a substrate supporting the latter cannot occur.

In FIGS. 3 to 5 the microlenses 561Y, 561X, 562Y, 562X are represented as subelements that have plane back surfaces and are attached to plane back surfaces of the adjacent microlenses. However, the integrator members 561, 562 will usually not be assembled from separate subelements, but will be manufactured in a more efficient way, for example by molding or by machining a substrate having originally plane and parallel surfaces. The technology used for manufacturing the integrator members 561, 562 also depends on the pitch of the microlenses 561X, 561Y, 562X, 562Y, which may be in the range of one or several millimeters. However, for reasons explained further below with reference to FIG. 6, it may be desirable to have a pitch below 1 mm, for example 500 µm. The pitch generally denotes the width of a microlens along the direction in which it has a refractive power. In the case of a cylinder lens, the pitch is equal to the dimension of the microlens perpendicular to its longitudinal extent.

From these remarks it becomes clear that the illustrations of FIGS. 3 to 5 are greatly simplified and not to scale. For example, if the integrator members 561, 562 have lateral dimensions of 25 mm and the pitch of the microlenses equals 500 µm, each array will be made up of 50 microlenses. It is to be understood, however, that the pitch and the number of microlenses 561X, 561X having a refractive power in the X direction do not have to be equal to the pitch and number of the microlenses 561Y, 561Y having a refractive power in the Y direction.

In order to keep transmission losses small, the integrator members 561, 562 shown in FIGS. 3 to 5 are made of $CaF_2$, which has, for the contemplated wavelength of 193 nm, a higher transmission than fused silica ($SiO_2$)·If wavelengths below 193 nm are used, fused silica is almost opaque so that $CaF_2$ or a similar fluorite material should be used.

Since $CaF_2$ is a brittle material that is difficult to machine, the thickness of the substrate should exceed approximately 2 mm. If the pitch of the microlenses 561Y, 561X, 562Y, 562X shall be kept below 1 mm and the refractive power of the microlenses 561X, 562X shall be sufficient to produce a numerical aperture NA in excess of about 0.2, a sequence of microlens arrays having refractive power in the Y direction, the X direction, the X direction and the Y direction, as is the case in FIGS. 3 to 5, is the only possible way. With other configurations, for example the configuration disclosed in U.S. Pat. No. 4,682,885 A, all aforementioned conditions could not be simultaneously fulfilled.

It is to be understood that the configuration of the optical integrator may be varied in various kinds. For example, the microlenses 561Y, 561X, 562Y, 562X may be concavely or aspherically shaped. Aspherical microlenses may be used, for example, for achieving special non-uniform irradiance distributions in the mask plane 70, for example distributions in which the irradiance at the edges is slightly higher than in the centre. More particularly, the irradiance at the edges of the illuminated field may be at least 0.5% to 0.8% higher than in the center of the illuminated field. Such a nonuniform irradiance distribution provides compensation if light emerging from edges experiences higher losses in the projection objective that light emerging from the center.

Furthermore it may be advantageous if adjacent microlenses are different, as is described in US Pat. Appl. No. 2005/0018294 A1 that has been mentioned further above. Instead of using microlenses formed as convexly curved cylinder lenses, other configurations may be contemplated as well, for example embodiments including an array of rotationally symmetrical microlenses or microlenses that are obtained by crossing two arrays of microlenses having a cylindrical or toric shape. Similar configurations are shown in FIGS. 33 to 36 below for the first scattering plate 58.

Apart from that it is also contemplated to use diffractive optical elements instead of the microlenses for achieving refractive power in the X and/or Y direction.

3.2 Function of Optical Integrator

In the following the function of the optical integrator 56 will be briefly explained.

If this projection light beam is perfectly collimated so that all light rays are parallel to the Z axis, the second integrator member 562 may be dispensed with. The first integrator member 561 then alone produces a plurality of secondary light sources. A light beam falling on the first integrator member 561 is diverted in the Y direction and, to a larger extent due to the larger refractive power of the microlenses 561X, 562X, in the X direction. Thus each secondary light source produces an anamorphic angular distribution.

However, the light impinging on the optical integrator 56 is usually not perfectly collimated, but has a small divergence. Without the second integrator member 562, this divergence would cause a parallax that may result in an undesired shift of the illuminated field 14 on the mask 16.

The second integrator member 562 ensures that a parallax does not occur even if the impinging light is not perfectly collimated. As becomes clear from FIGS. 4 and 5, the second integrator member 562 has little effect on parallel rays impinging on the optical integrator 56, since the focal lines are located on the vertices of the micro lenses 562X, 562Y of the second integrator member 562. For rays hitting the optical integrator 56 not parallel to the Z axis but under a certain angle, the microlenses 562X, 562Y of the second integrator member 562 ensure that these rays are transformed into telecentric bundles.

Figure 6:
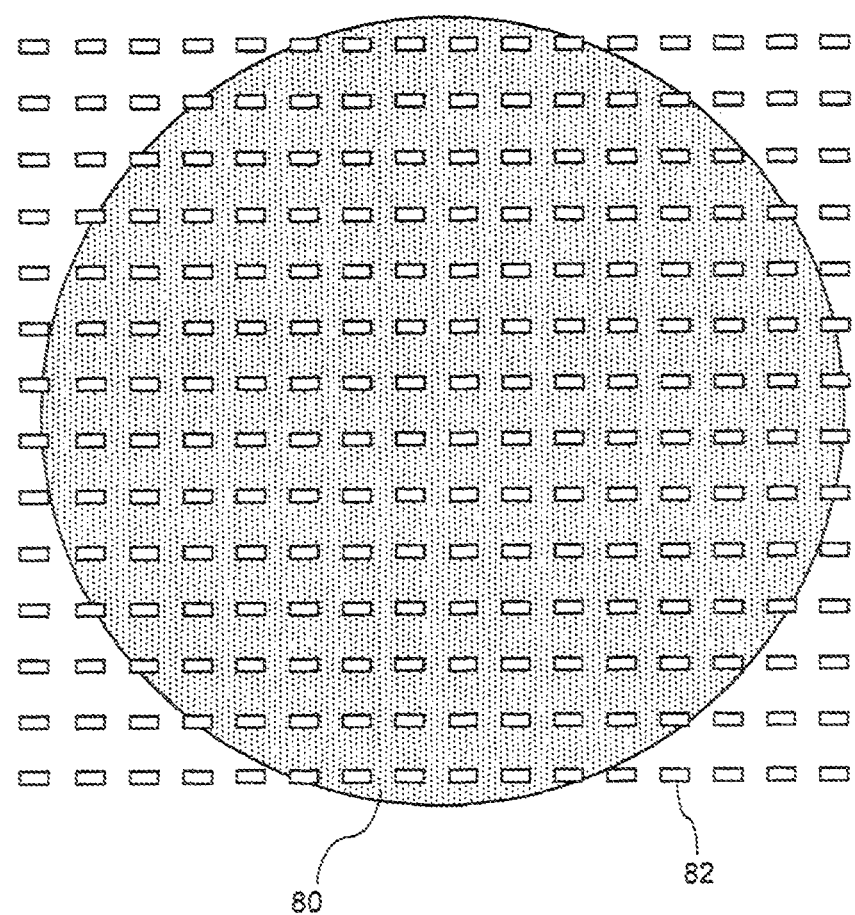
FIG. 6 is a schematic representation of secondary light sources produced by the optical integrator.

FIG. 6 shows in a schematic representation secondary light sources 82 produced in the second integrator member 562 as viewed from the mask side along the optical axis 26. Only those secondary light sources 82 contribute to the illumination of the mask 16 that are actually exposed to the projection light beam impinging on the optical integrator 56. The shape of this projection light beam depends on the illumination setting. For example, in a conventional illumination setting with maximum coherence parameter σ the optical elements preceding the optical integrator 56 in the path of light produce a projection light beam having a circular cross-section that is indicated in FIG. 6 by 80.

Ideally all secondary light sources 82 produce light bundles having the same angular (anamorphic) distribution. In a subsequent Fourier transformed field plane, namely the field stop plane 64 or the mask plane 70 conjugated thereto, these angular distributions translate into irradiance distributions. If the angular distribution produces by the secondary light sources is a rectangular distribution in which all angles occur with the same irradiance, a perfectly uniform irradiance distribution is obtained in the mask plane 70.

However, due to manufacturing tolerances and other reasons, the angular distributions produced by the secondary light sources 82 are usually not perfectly identical. Nevertheless a homogeneous irradiance distribution will be obtained in the mask plane 70 if the angular distributions of the secondary light sources 82 statistically vary. If the number of secondary light sources 82 is sufficiently large, all non-homogeneous irradiance distributions produced by each secondary light source 82 superpose in the mask plane 70, and irradiance variations will be cancelled out due to the averaging effect achieved by the superposition of all irradiance distributions produced by the secondary light sources 82.

From this it becomes clear that it is advantageous to have a large number of secondary light sources because this improves the aforementioned averaging effect. Another advantage of having a large number of secondary light source, and thus a small pitch of the microlenses 561X, 561Y, 562X, 562Y, is that the illumination system 12, and in particular the first optical raster element 34, the zoom objective 46 and the pair 48 of axicon elements 50, 52, makes it possible to produce a wide variety of different illumination settings. This involves that the cross-section of a light beam impinging on the optical integrator 56 may differ significantly.

If the number of secondary light sources is small and there are significant gaps between the secondary light sources, there may be symmetric illumination settings wherein the "active", i.e. illuminated, secondary light sources are not symmetrically distributed over the clear aperture 80. This may cause undesired asymmetric angular distributions of the projection light impinging on the mask 16. In contrast, if there is a large number of small and densely arranged secondary light sources, the probability of significant asymmetries of this kind is reduced.

3.3 Alternative Arrangements of Optical Integrator

In the following various alternative arrangements of the microlens arrays and the scattering plates 58, 60 will be described with reference to FIGS. 7 to 12. Between subsequent embodiments, corresponding parts are denoted by reference numerals increased by 1000 and will not always be referred to again.

Figure 7:
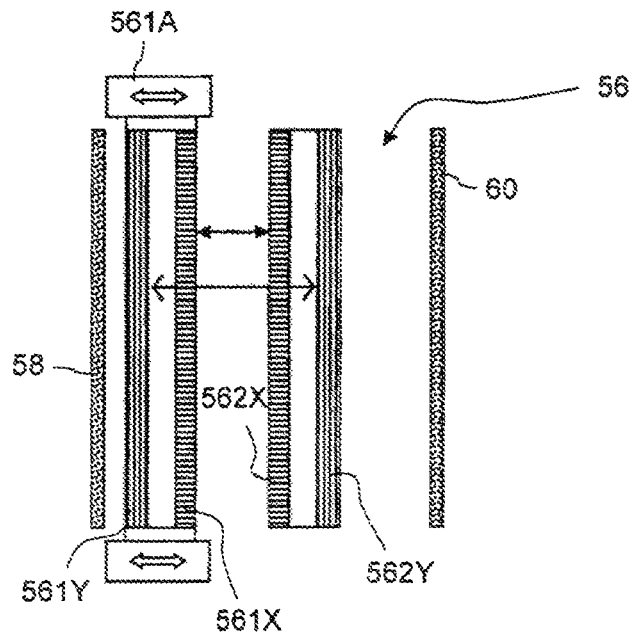
FIG. 7 is a side view of the optical integrator shown in FIG. 3.

FIG. 7 shows the optical integrator 56 and the scattering plates 58, 60 of FIG. 3 in a side view. In this and the similar representations of FIGS. 8 to 12 cylindrical microlenses extending along the X direction are hatched with vertical lines, whereas cylindrical microlenses extending in the Y direction are hatched with horizontal lines.

FIG. 7 differs from FIGS. 3 to 5 in that the first integrator member 561 may be adjusted with the help of an adjusting device 561A. The adjusting device 561A is only schematically indicated and may be driven using a micrometer screw or a piezo element, for example. Via the adjusting device 561A it is possible to adjust the distance between the integrator members 561, 562 along the Z axis. The focal lines produced by the first microlenses 561Y can then be positioned exactly on the vertices of the fourth microlenses 562Y. Alternatively, the focal lines produced by the second microlenses 561X can be positioned exactly on the vertices of the third microlenses 562X.

Figure 8:
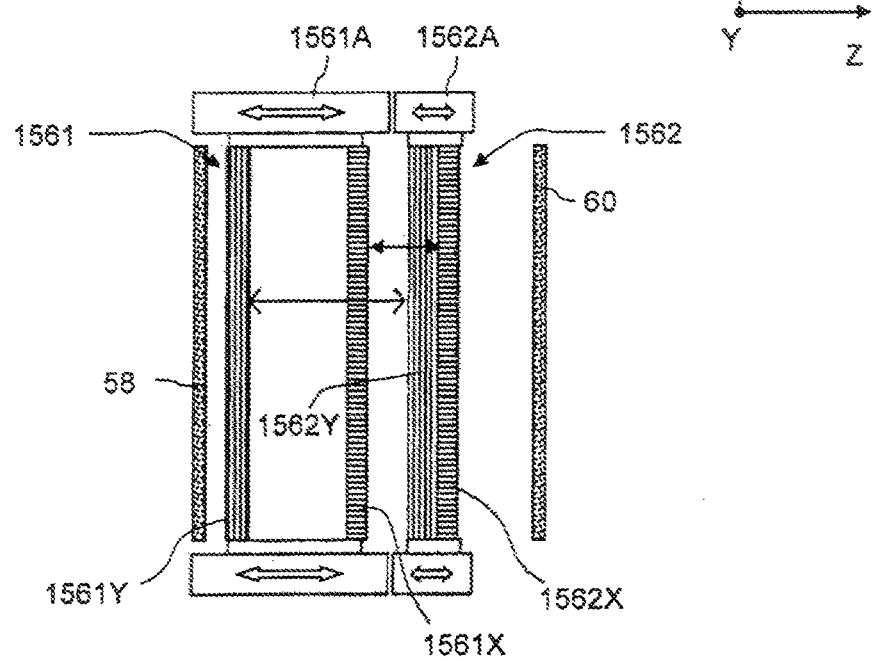
FIGS. 8 to 12 show optical integrators in representations similar to FIG. 7.

FIG. 8 shows the last two microlens arrays are arranged in reversed order. Thus third microlenses 1562Y having refractive power in the Y direction are now facing second microlenses 1561X of the first integrator member 1561. In order to maintain the aforementioned focal line property, which is indicated in FIGS. 7 to 12 by arrows having different lengths and style, the first integrator member 1561 has to be quite thick, whereas the second integrator member 1562 has to be quite thin. For facilitating the manufacture of the integrator members 1561, 1562, the support for the microlenses should therefore be made of a material that is less brittle than $CaF_2$, for example fused silica.

FIG. 8 has a second adjusting device 1562A for the second integrator member 1562. Having independent adjusting devices for each integrator member 1561, 1562 makes it possible not only to adjust the distance spacing between the integrator members 1561, 1562, but also the distance of the integrator members 1561, 1562 with respect to the scattering plates 58, 60.

Figure 9:
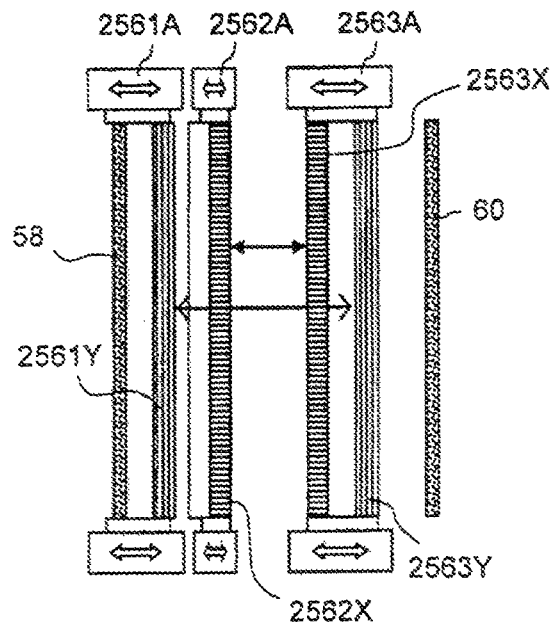

FIG. 9 differs from FIG. 7 only in that second microlenses 2561X are formed not on the same support as first microlenses 2561Y, but on a separate support that may also be made of $CaF_2$, for example. With the help of an adjustment device 2562A, the second microlenses 2561X may be adjusted along the Z direction independently from first the micro lenses 2561Y and third and fourth microlenses 2563X, 2563Y arranged on a common third support. Having three integrator members attached to separate adjusting devices 2561A, 2562A, 2563A makes it possible to adjust the distances between each pair of corresponding micro lens arrays independently. Having three adjustable micro lens arrays can therefore an optimum solution if full adjustability is desired with as little complexity as possible.

Figure 10:
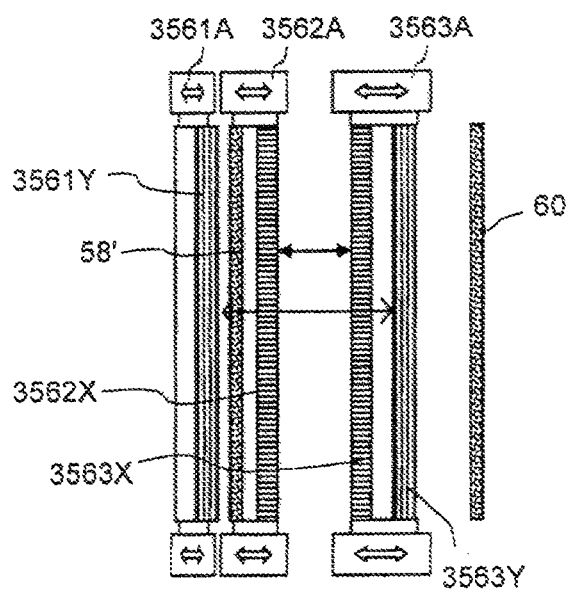

FIG. 10 differs from FIG. 9 in that the first scattering plate 58 is now arranged between first microlenses 3561Y and 3562X. The scattering plate 58 may simply be shifted as a whole, or its function may be achieved, as shown in FIG. 10, by forming a scattering structure 58' on the other side of a substrate on which the second microlenses 3562X are formed.

Figure 11:
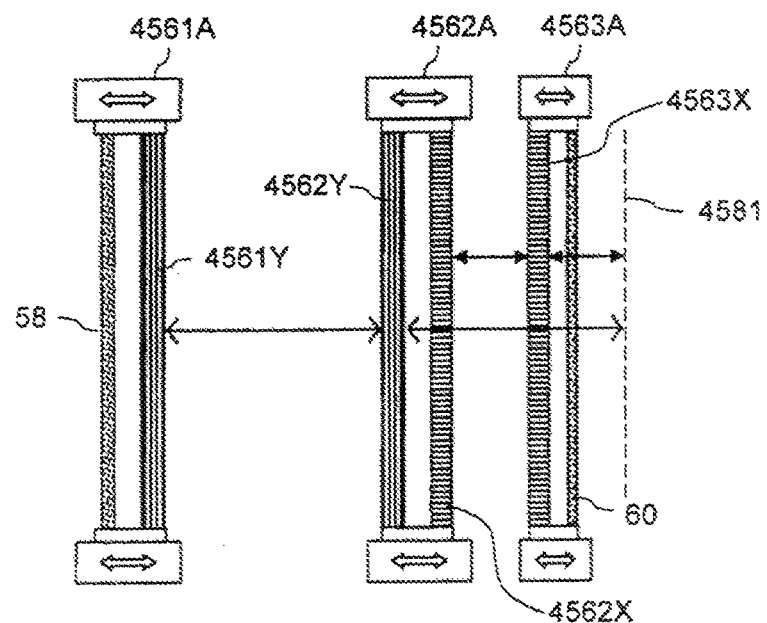

FIG. 11 shows an optical integrator having three integrator members that may be independently adjusted with the help of adjusting devices 4561A, 4562A and 4563A. First and second microlenses 4561Y and 4562Y having a refractive power in the Y direction are arranged on different substrates so that they are facing each other. Third and fourth microlenses 4562X and 4563X are facing each other, too. The second microlenses 4562Y and the third microlenses 4562X are formed on the same substrate and may therefore be commonly adjusted by the second adjusting device 4562A. Here the distances between the integrator members 4561, 4562 and 4563 are selected such that the back focal lines of the second microlenses 4562Y and the fourth microlenses 4563X are positioned in a common plane 4587. This plane 4587 may then be Fourier transformed into the field stop plane 64 by the condenser 62. As a matter of course, a similar property may also be achieved in FIG. 8, because the fourth microlenses 1562X having the shorter focal lengths are positioned behind the third microlenses 1562Y having the longer focal lengths.

Figure 12:
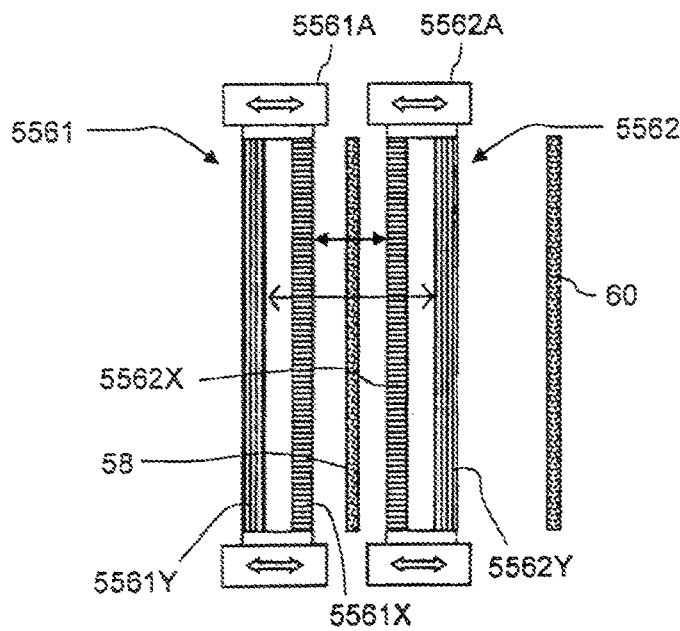

FIG. 12 is similar to in FIG. 7. However, the first scattering plate 58 is not positioned in front of the optical integrator, but between the integrator members 5561, 5562.

4. First Scattering Plate

In the following the general function and various embodiments for the first scattering 58 plate will be explained in more detail. As a matter of course, this also holds true for the other embodiments of the optical integrator 56 shown in FIGS. 7 to 12. However, for the sake of simplicity the following remarks will refer only to FIGS. 3 to 6.

4.1 General function of First Scattering Plate

One function of the first scattering plate 58 is to adapt the small geometrical optical flux produced by the light source 30 (and possibly by the first optical raster element 34, if inserted) to the higher geometrical optical flux of the optical integrator 56. This has the advantageous effect of preventing high light intensities within the second integrator member 562 that could destroy the material of which the optical integrator 56 is made.

In this respect it should be noted that, although the focal lines produced by the first and second microlenses 561Y, 561X are located on the vertices of the fourth microlenses 562Y and third microlenses 562X, respectively, and not inside these microlenses, high light intensities may nevertheless occur in the immediate vicinity of the vertices. The first scattering plate 58 ensures that the projection light impinging on the first integrating member has a sufficient divergence such that narrow focal lines, as are shown in FIGS. 4 and 5, are avoided. Ideally, the first scattering plate 58 is adapted to the second micro lenses 561X such that light passing a microlens 561X completely illuminates a third corresponding micro lens 562X in the second integrator member 562. Mathematically, this condition may be described by $$0.5 \cdot (D/2f_2 - NA_{pre}) < NA_{SC} < (D/2f_2 - NA_{pre})$$

where D is the diameter of the array of second microlenses 561X, NAsc is the numerical aperture of the first scattering plate 58 and $NA_{pre}$ is the numerical aperture of the light impinging thereon.

Figure 13:
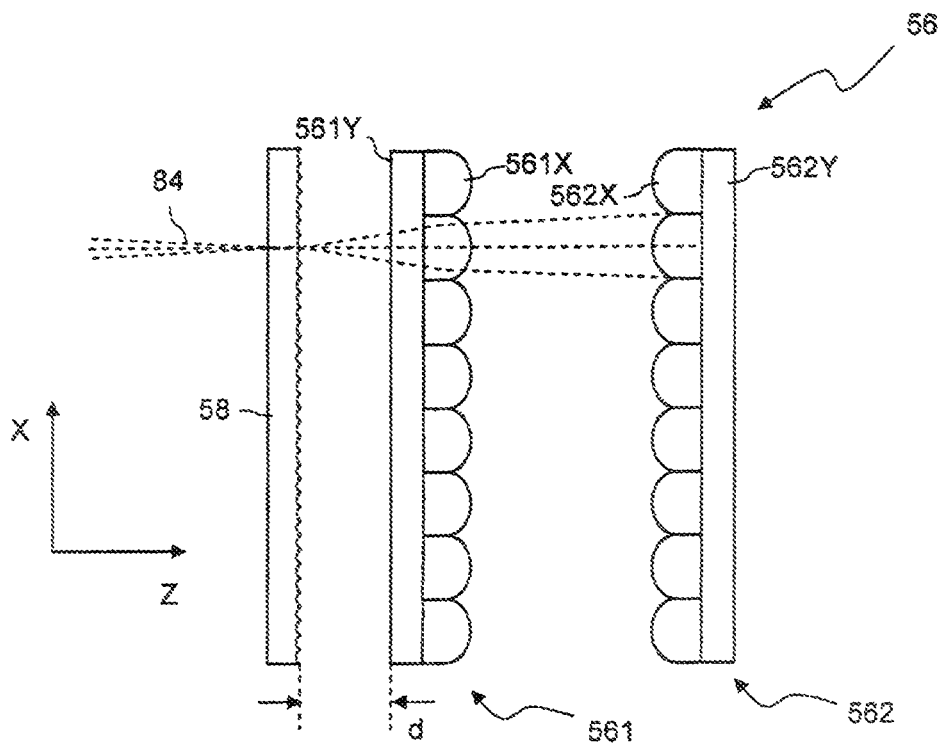
FIG. 13 is a section through the optical integrator and the first scattering plate parallel to an X-Z plane.

This is shown in FIG. 13 in a representation similar to FIG. 4. In this illustration it is indicated that projection light 84 impinging on the scattering element 58 has a low divergence. Without the first scattering plate 58, the projection light 84 would be focused by the second micro lenses 561X on the vertices of the third microlenses 562X, as is shown in FIG. 4. The first scattering plate 58, however, increases the divergence to such an extent that light, which passes through a second microlens 561X, is not focused on the vertex of the corresponding third microlens 562X, but is distributed over its entire curved surface.

In projection exposure apparatus of the scanner type, the field 14 illuminated on the mask 16 has a high aspect ratio. This means that the dimension of the field 14 along the scan direction (the Y direction) is much shorter than its dimension along the X direction. In the absence of any stops that block out projection light, the aspect ration of the illuminated field would be determined by the maximum angles of the projection light in the X and Y direction occurring in the pupil plane 54.

This means that the projection light passing the pupil plane 54 should have a small divergence in the Y direction and a larger divergence in the X direction. This is the reason why the first focal length fi of the first and fourth microlenses 561Y, 562Y is larger than the focal length $f_2$ of the second and third microlenses 561X, 562X. Since the first scattering plate 58 additionally increases the divergence, as is shown in FIG. 13, the amount of the divergence introduced by the first scattering plate 58 in the X and Y directions should be carefully adapted to the divergence introduced by the optical integrator 56. For that reason the divergence introduced by the first scattering plate 58 is generally higher in the X direction than in the Y direction. In the case of illuminated fields 14 having a very large aspect ratio, the first scattering plate may even be designed such that it increases the divergence only in the X direction but not (or not substantially) in the Y direction.

Figure 14:
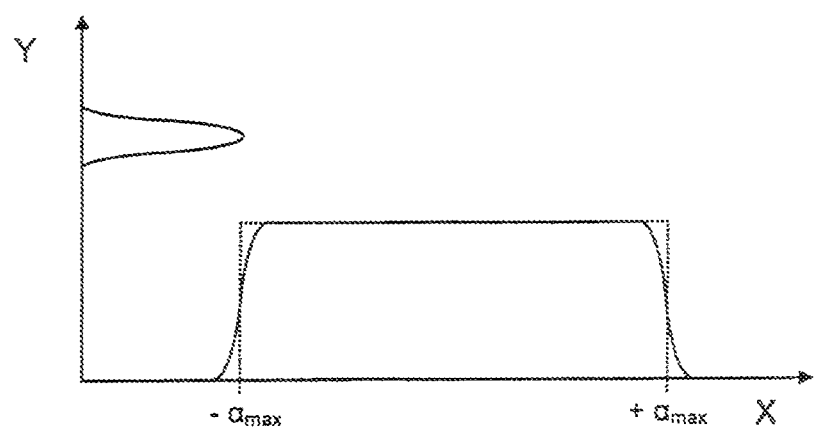
FIG. 14 is a graph illustrating the angular distribution produced by the first scattering plate shown in FIG. 13.

FIG. 14 shows a graph illustrating the angular distribution of projection light after having traversed the first scattering plate 58. As can be seen in FIG. 14, the angular distribution in the X direction is substantially rectangular. This means that all angles having an absolute value smaller than a maximum angle $\alpha_{max}$ occur with the same intensity. However, even with an ideal first scattering plate 58 such a rectangular angular distribution cannot be obtained because the light source 30, which is usually realized as a laser, produces projection light that has itself an angular distribution. In the case of a laser light source, this distribution has a Gaussian shape which results in smooth slopes at the maximum angles $\pm \alpha_{max}$. For the same reason the light has a small angular distribution in the Y direction even if the first scattering plate 58 does not as such increase the divergence in the Y direction. In this case the angular distribution in the Y direction is given by the Gaussian angular distribution produced by the laser light source.

If the first scattering plate 58 has a strongly anamorphic effect, i.e. increasing the divergence in the X and Y direction to different extents, it should be positioned rather close in front of the optical integrator 56. In some embodiments, the distance z between the first scattering plates 58 and the optical integrator is below 20 mm.

Another important function of the first scattering plate 58 is to increase the size of the secondary light sources 82. This increase is due to the fact that the third microlenses 562X are now more completely illuminated so that the size of the secondary light sources in the X direction increases. In the Y direction the size of the secondary light sources increases only if the first scattering plate 58 increases the divergence also in the Y direction.

Figure 15:
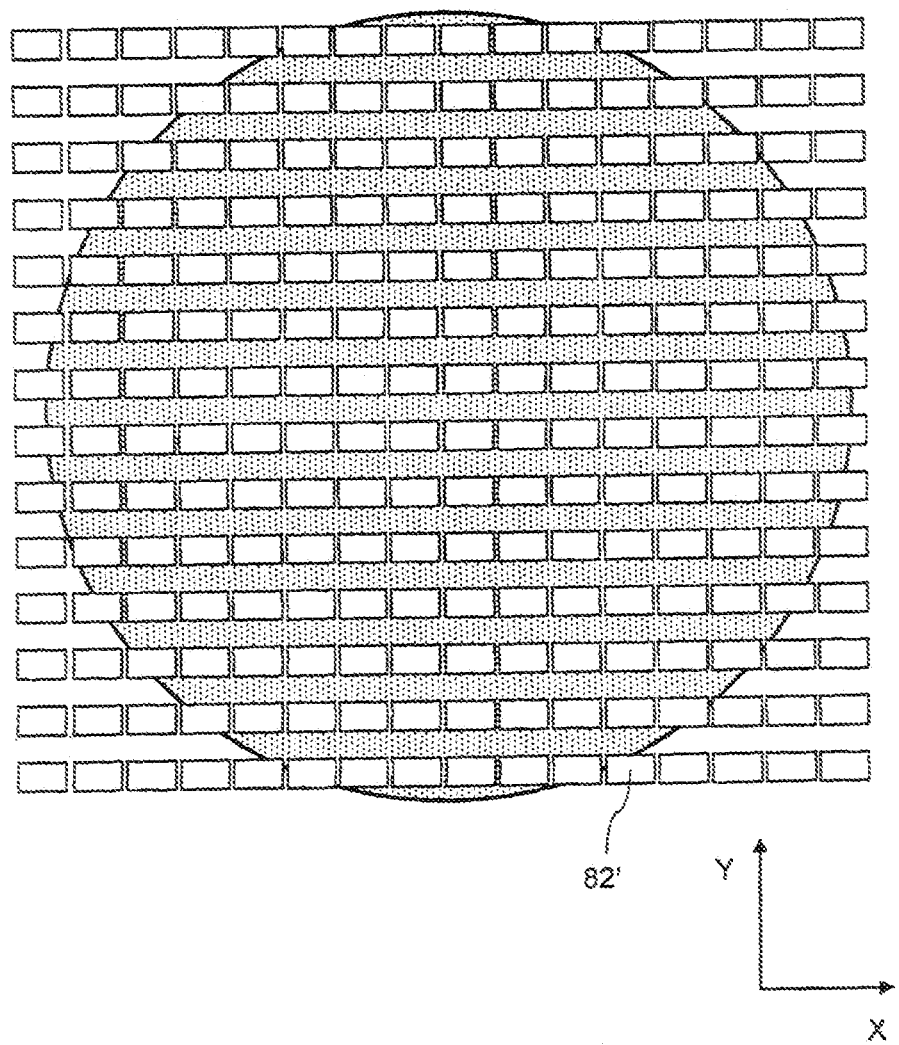
FIG. 15 is a schematic representation of the secondary light sources similar to FIG. 6 as it is produced when using the first scattering plate shown in FIG. 13.

FIG. 15 shows, in a representation similar to FIG. 6, the secondary light sources 82' that are obtained with a first scattering plate 58 producing an anamorphic angular distribution. In comparison with the secondary light sources 82 shown in FIG. 6, the secondary light sources 82' are now broadened in the X direction so that the gaps extending along the Y direction between adjacent secondary light sources almost vanish. The more completely the secondary light sources 82' fill the pupil, the more continuous are the angular distributions obtained in the mask plane 70. The second scattering plate 60 which will be described further below, may further enhance the filling factor of the pupil.

In section 4.3 various embodiments of first scattering plates 58 will be described which ensure that the first and second micro lenses 561Y, 561X of the first integrator member 561 are traversed by projection light having random or randomized angular distributions. As a result, the secondary light sources 82' shown in FIG. 15 produce, at least in general, different angular distributions and thus different irradiance distributions in the mask plane 70. However, due to the random or randomized angular distributions produced by the first scattering plate 58, these irradiance distributions in the mask plane 70 also vary statistically. The superposition of a large number of statistically varying irradiance distributions in the mask plane 70 results in an overall irradiance distribution that is almost perfectly homogeneous.

From these remarks it also becomes clear that the first scattering plate 58 significantly contributes to the irradiance distribution in the mask plane 70, and for that reason its optical properties should be carefully designed.

Generally, the first scattering plate 58 should be designed such that the scattering effect is substantially independent from the position where a light beam impinges on the plate. This involves substructures that produce the entire angular distribution should be small in comparison to the pitch of the microlenses 561Y, 561X contained in the first integrator member 561. Such a relation is considered to be fulfilled if the pitch of the substructures is smaller than 20%, preferably smaller than 10%, of the pitch of the corresponding first or second microlenses 561Y, 561X.

In principle it is possible to realize the first scattering plate 58 as a conventional glass disc having one or two etched or ground surfaces, for example. Such conventional scattering plates have the advantage that the angular distribution varies completely randomly over its surface, which is generally a desired effect for the reasons explained above. On the other hand, these conventional scattering plates have the disadvantage that their optical properties cannot be tailored to the specific desired properties well enough. For example, it is usually not possible to obtain a strongly anamorphic angular distribution in the X and Y directions as is shown in FIG. 14. Instead, conventional scattering plates produce a very broad angular distribution both in the X and the Y direction. As a result, a significant amount of light has to be blocked by field stops in order to obtain an illuminated field 14 having a high aspect ratio.

For that reason various alternatives are proposed below how the first scattering plate 58 may be realized such that its optical properties may be accurately determined by its design. Nevertheless the first scattering plate 58 shall have certain randomized or carefully selected regular properties that are involved for preventing undesired interactions with the regular features of the optical integrator 56.

4.2 Undesired Interactions Between First Scattering Plate and Optical Integrator Before various embodiment of the scattering plate 58 are described in more detail, possible interactions between the scattering plate 58 and the optical integrator 56 will be explained.

4.2.1 Superposition

Figure 16:
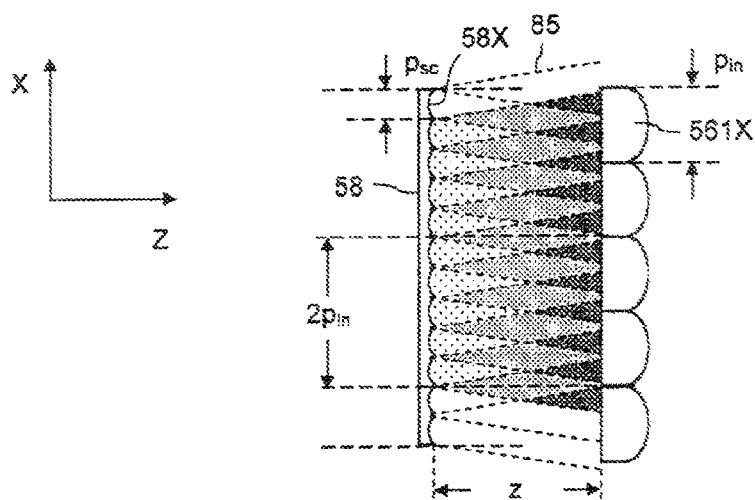
FIG. 16 is an enlarged cutout of FIG. 13.

FIG. 16 is an enlarged cutout of FIG. 13 and schematically shows the light propagation between substructures 58X of the first scattering plate 58 and second microlenses 561X of the first integrator member 561. For the sake of simplicity the first microlenses 561Y and a support for the substructures 58X are not shown because these elements do not have an impact on the angular distribution of the projection light in the X direction. The substructures 58X are formed by cylindrical microlenses having longitudinal axes that extend along the Y direction. Each substructure 58X produces a divergent light bundle indicated by broken lines 85. The pitch of the microlenses 561X and the substructures 58X is denoted by $pi_n$ and $p_{sc}$, respectively. In this specific embodiment so that every two microlenses 561X a sequence of 5 substructures 58X is repeated.

The larger the distance z between the first scattering plate 58 and the second micro lenses 561X is, the larger is the number of divergent light bundles 85 that superimpose on the second microlenses 561X. This is illustrated in FIG. 16 by different degrees of shading. As a result of this superposition, there is a periodic irradiance variation along the X direction. The amount of the fluctuations decreases with growing distance z because the irradiance of a single light bundle produced by a substructure 58X decreases with $z^2$.

As a result of these fluctuations, also the angular distribution of the light impinging on the microlenses 561X may be different. For example, the upper two microlenses 561X shown in FIG. 16 are subjected to different, although symmetrical, irradiance and angular distributions. As a result of the relationship $p_{sc}=2/5 \cdot pi_n$, every second one of the second microlenses 561X is subjected to the same irradiance and angular distribution, and thus every second secondary light source 82 will be equal. If only two different types of light sources 82 are present in the pupil plane 54, the different irradiance distributions in the mask plane 70 will not have an averaging effect to such an extent that a substantially homogeneous irradiance distribution is achieved.

Figure 17:
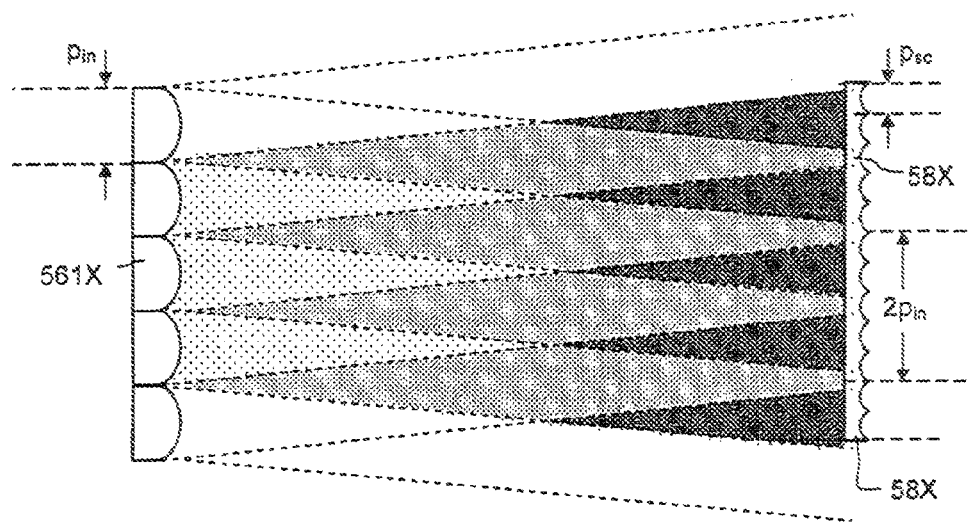
FIG. 17 is an illustration similar to FIG. 16 in which the first scattering plate is arranged between two integrator members.

FIG. 17 shows the first scattering plate 58 is not arranged in front of, but behind the first integrator member 561, as is the case in FIGS. 10 and 12. From this illustration it becomes clear that reversing the sequence of the second microlenses 561X and the substructures 58X does not solve this problem because the irradiance and angular distribution on the first scattering plate 58 is repeated every 5 substructures 58X. Consequently, identical configurations of substructures 58X and second microlenses 561X still repeat quite frequently. Since each identical configuration produces the same secondary light source, the aforementioned averaging effect is small.

For example, even with a larger substructure pitches $p_{sc}=200$ μm, the period with which identical configurations repeat is 1 mm.

4.2.2 Talbot Effect

There is another effect that occurs in the case of combinations of microlens arrays in the optical integrator 56 and periodic scattering substructures in the first scattering plate 58. Periodic structures are known to form exact images of themselves at integer multiples of the distance through Fresnel diffraction when illuminated by a coherent or partial coherent wave. This self-imaging phenomenon is called the Talbot effect. In addition, multiple phase-transformed Fresnel images are produced at fractional-Talbot distances. The Talbot phenomenon indicates that in any plane behind a periodic optical element a certain periodicity is observed.

Figure 18:
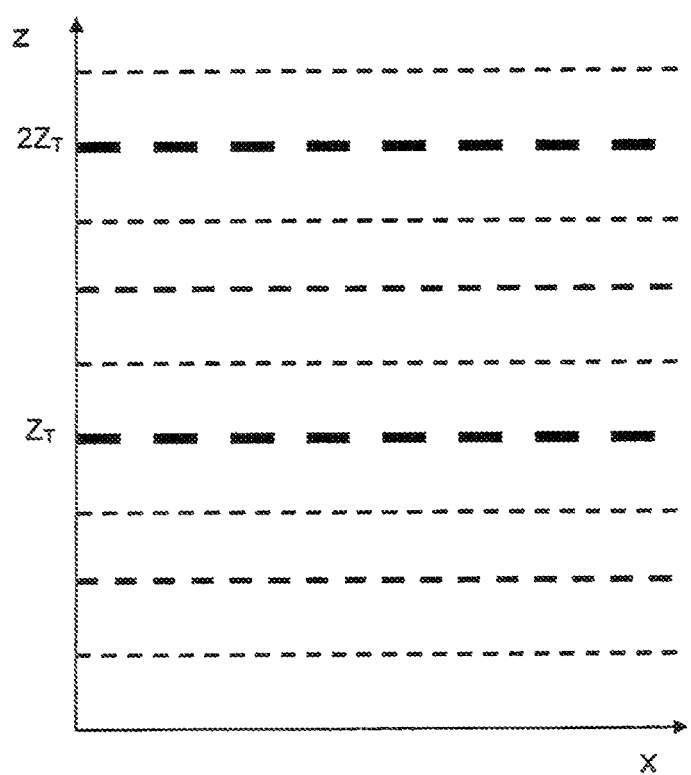
FIG. 18 is a graph schematically illustrating a plurality of Talbot interference patterns.

The Talbot effect manifests itself as significant interference patterns having a high contrast at certain distances from the periodic structures. These distances, which are referred to as Talbot distances $z_n$, are given by $Z_n = n \cdot Z_T$, where $Z_\tau = 2p^2/\lambda$. Here λ is the wavelength of the incident light, p is the period of the structures and n is a positive integer. However, interference patterns with a smaller contrast are also observed at certain fractional Talbot distances, for example at 2/9 $Z_\tau$ or 3/14 $Z_\tau$. FIG. 18 shows schematically Talbot interference patterns at Talbot distances $Z_\tau$ and $2Z_T$ and also at a number of fractional Talbot distances.

Since the Talbot effect is based on diffraction, it is most prominent if the degree of coherence is close to 100%. The laser light that illuminates one or more pitches of the first scattering plate 58 is generally partially coherent. The degree of coherence of the projection light may be estimated on the basis of the speckle contrast that is present at each point in the illumination system 12. Usually the speckle contrast is in the range between 10% and 20%. This is sufficient for observing prominent Talbot interference patterns at Talbot distances behind the first scattering plate 58.

High contrast interference patterns may occur at distances z in the order of 60 or 90 mm measured from the first scattering plate 58. At these distances the superposition effect described above in 4.2.1 is negligible, at least with scattering substructure pitches $p_{sc}$ below 100 μm.

If the distance between the first scattering plate 58 and the first integrator member 561 is equal or close to a (fractional) Talbot distance in which high contrast interference patterns occur, Moire patterns are observed that are a result of the periodic Talbot interference pattern on the one hand and the periodic arrangement of the first and second microlenses 561Y, 561X on the other hand. Although the irradiance distributions produced by each secondary light source 82 superimpose in the mask plane 70, these Moire interference patterns may nevertheless introduce non-uniformities of the irradiance distribution in the mask plane 70.

4.3 Different Design Approaches

In the following different approaches will be described that may be employed to avoid the undesired interactions described above in section 4.2.

4.3.1 Distance

For avoiding Moire patterns caused by interactions between Talbot inference patterns and arrays of microlenses contained in the first integrator member 561, care should be taken that the distance z between the first scattering plate 58 and the first integrator member 561 does not coincide with a Talbot distance or any fractional Talbot distance in which high irradiance contrasts are observed. A range of suitable distances may be determined with the help of simulation programs which compute the contrast of Talbot interference patterns in various integer or fractional Talbot distances.

4.3.2 Pitch Selection

Figure 19:
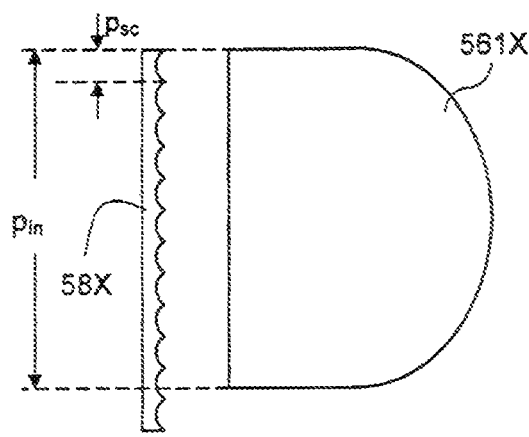
FIG. 19 is a still further enlarged cutout similar to FIG. 16.

FIG. 19 shows, in a further enlarged view similar to FIG. 16, a first approach how too frequent identical configurations of substructures 58X and second microlenses 561X may be avoided. The second microlenses 561X and the substructures 58X have pitches $pi_n=500$ μm and $p_{sc}=47$ μm, respectively. 47 is prime to 500 so that the irradiance and angular distribution produced by the concave microlenses 58X is repeated on the second microlenses 561X only after 47·500 μm=23.5 mm.

Figure 20:
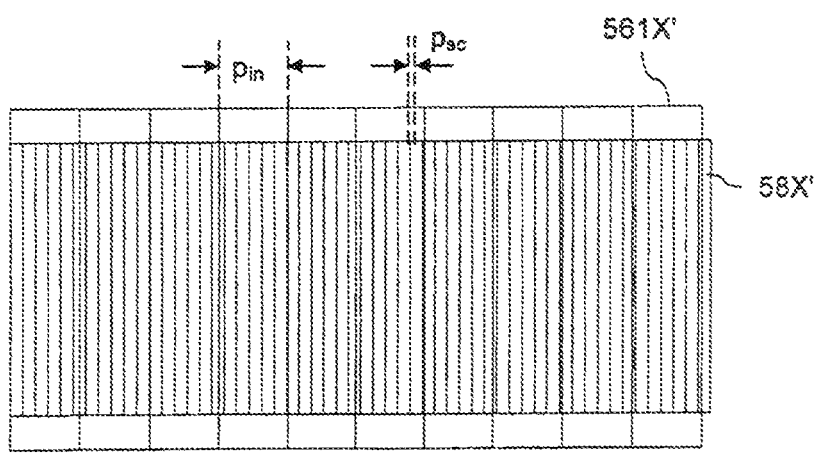
FIG. 20 is a top view of two grids for illustrating the merits of an embodiment.

FIG. 20 shows, for illustrative purposes only, a top view of a first grid 561X' and a second grid 58X' having pitches that are selected such that over 10 periods of the first grid 561X' the lines of the second grid 58X' always have a different relative position to a single period of the first pitch 561X'.

4.3.3 Irregular Substructures in Scattering Plate

Another approach to avoid frequent identical configurations of substructures 58X and second microlenses 561X is to use irregular substructures. The irregularity may be in terms of the arrangement of identical substructures and/or manifest itself in different substructures. It should be noted that this approach may be combined with the pitch selection according to section 4.3.2.

In the embodiments described above the substructures 58X of the first scattering plate 58 are realized as cylindrical microlenses. However, a divergence in one or two directions may also be produces with the help of diffractive optical elements. In the following sections various embodiments of refractive and diffractive designs for the first scattering plate 58 will be described.

4.3.4 Refractive Designs

Figure 21:
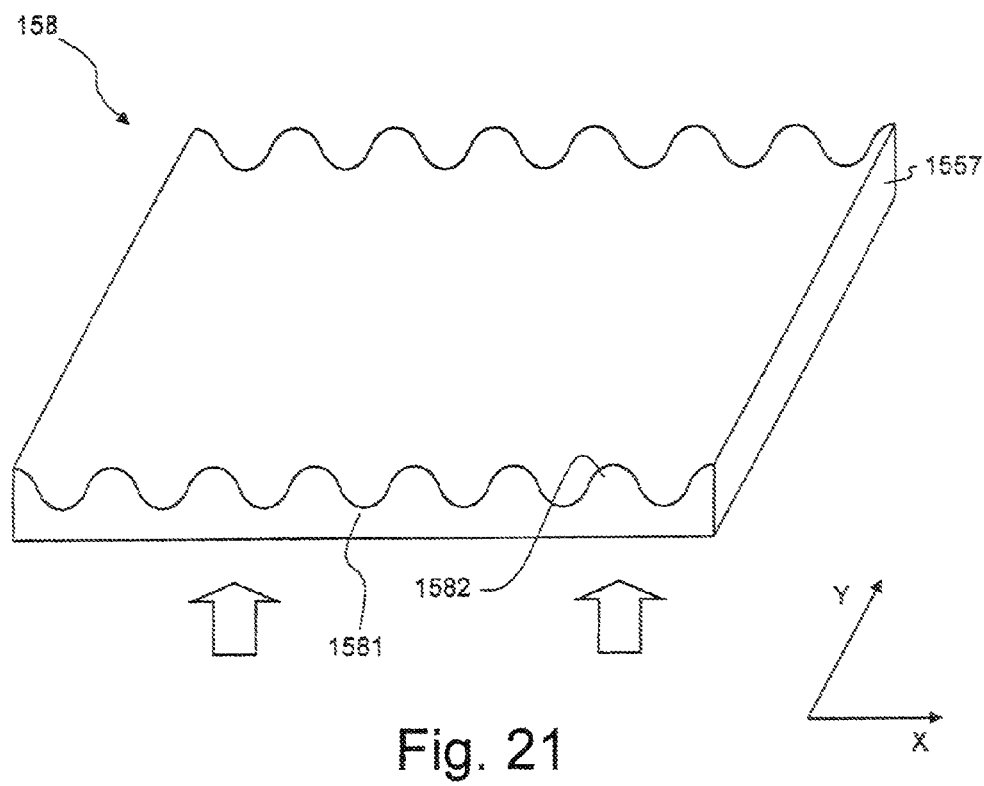
FIG. 21 is a perspective view of a first scattering plate.
Figure 22:
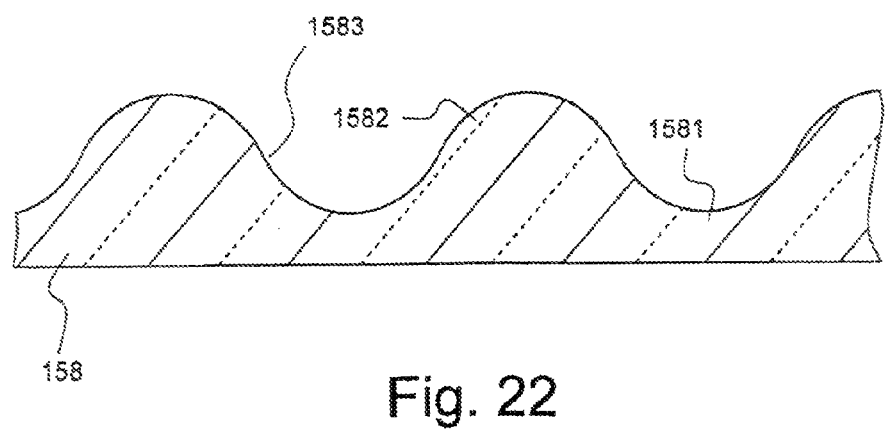
FIG. 22 is a section through the first scattering plate shown in FIG. 21 in an X-Z plane.

FIGS. 21 and 22 show a first scattering plate 158 in a perspective and a sectional view along the X direction, respectively. The first scattering plate 158 includes an array of alternating convex cylindrical microlenses 1581 and concave cylindrical microlenses 1582 that both extend along the Y direction. The scattering plate 158 thus increases the divergence only in the X direction. Due to the cylindrical shape with constant curvature the angular distribution is, at least to a good approximation, rectangular in the X direction.

If the divergence shall be increased also in the Y direction, a similar array of microlenses 1581, 1582 may be provided on the other side of the first scattering plate 158, but with an orthogonal orientation of the microlenses. In principle it is also possible to have other than orthogonal orientations, as will be explained further below in section 5.2.1, to have crossed microlenses on one side of the plate, or to provide separate supports for the each array of microlenses. If the divergence produced by the first scattering plate 158 shall be smaller in the Y direction than in the X direction, the curvature of the microlenses producing a divergence in the X direction has to be smaller than the curvature of the microlenses producing a divergence in the Y direction.

The microlenses 1581, 1582 may be formed by molding or by machining a substrate 1557 in a manner that is similar to the manufacture of the microlenses contained in the optical integrator 56.

Various embodiments of first scattering plates will now be described with reference to FIGS. 23 to 32, which show similar to FIG. 22 cross-sections along the X direction. As a matter of course, also in these embodiments a second array of orthogonal microlenses may be provided on the other side of the support, the same side of the support or on a different support if the divergence shall be increased in the Y direction as well. Furthermore, it is also possible to have different designs for microlenses producing a divergence in the X direction and micro lenses producing a divergence in the Y direction.

Figure 23:
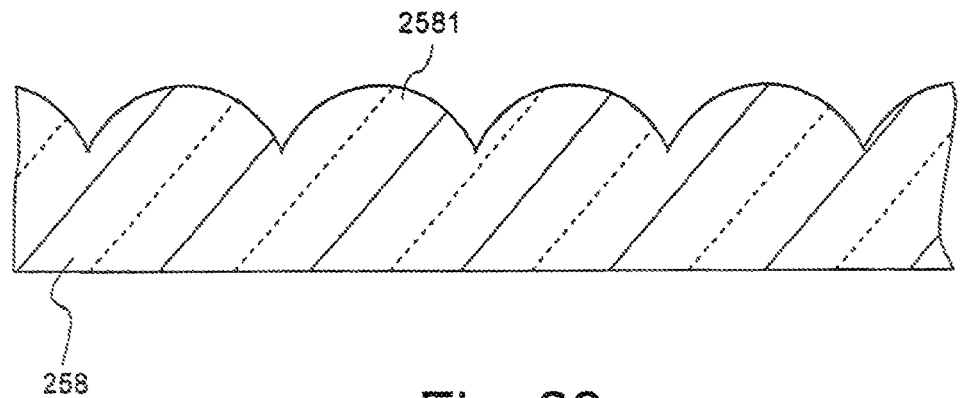
FIGS. 23 to 28 show various embodiments for the first scattering plate in a side views similar to FIG. 22.

FIG. 23 shows a cross-section through a first scattering plate 258 that includes only convex cylindrical microlenses 2581 having the same shape.

Figure 24:
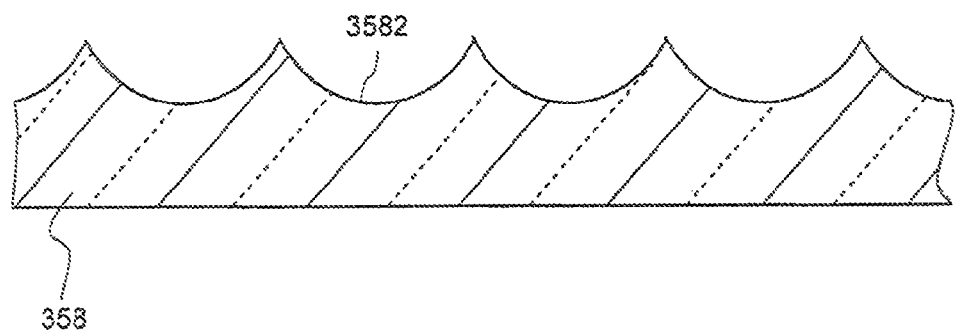

FIG. 24 shows a cross-section through a first scattering plate 358 that includes only concave cylindrical microlenses 3582 having the same shape.

Figure 25:
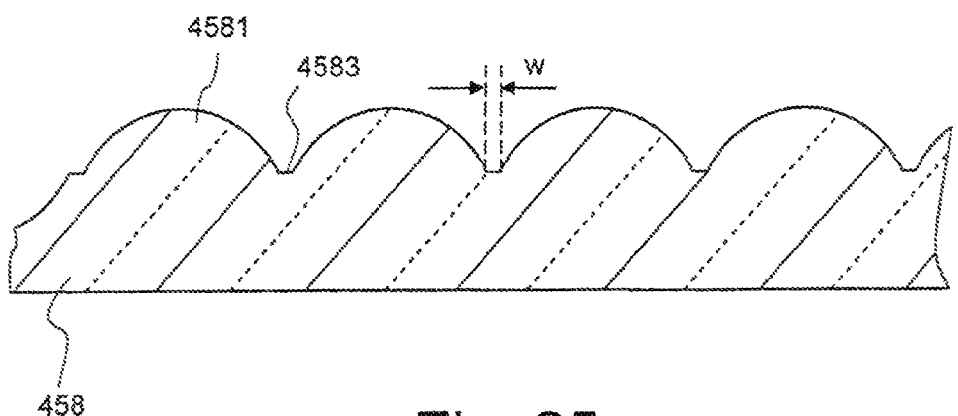

FIG. 25 shows a cross-section through a first scattering plate 458 that is similar to the scattering plate 158 shown in FIGS. 21 and 22. However, convex cylindrical microlenses 4581 are separated from each other by rectangular plane areas 4583 extending along the Y direction. This separation ensures that no sharp edges are present where adjacent microlenses 4581 meet. Such edges often have an undesired effect on the angular distribution.

If the plane areas 4583 have a large width w, a significant portion of the light traverses effectively a plane parallel plate, which does not increase the geometrical optical flux. However, the widths w of the areas 4583 are so small that the light is diffracted, similar to what is observed at an array of small slits. More particularly, the width w is determined such that the angular distribution caused by diffraction is at least approximately the same as the angular distribution caused by the microlenses 4581.

In the first scattering plates 258, 358 shown in FIGS. 23 and 24, respectively, all microlenses have an identical shape and form a regular array. In order to avoid undesired interaction with the first integrator member 561, the pitch of the microlenses should be carefully selected in accordance with section 4.3.2 above.

Figure 26:
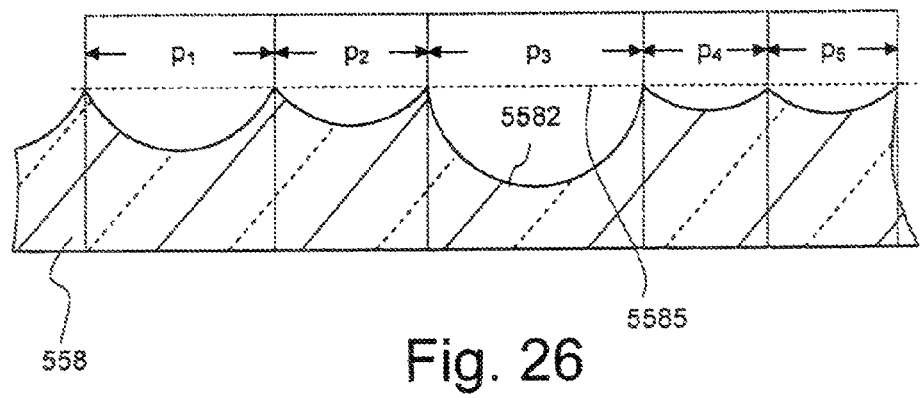

FIG. 26 shows a cross-section through a first scattering plate 558 that includes a plurality of different concave cylindrical micro lenses 5582. The microlenses 5582 have identical curvatures but different pitches $p_1, p_2, \ldots, p_n$. The longitudinal edges formed between adjacent microlenses 5582 are arranged in a plane 5585 which is parallel to a base plane of the first scattering plate 558.

The microlenses 5582 produce, as a result of their varying pitches $p_1, p_2, \ldots, p_n$, angular distributions having an approximately rectangular shape, but with varying widths. If the pitches $p_1, p_2, \ldots, p_n$ of the microlenses 5582 vary according to a Gaussian probability distribution, the overall angular distribution resulting from the contributions of all microlenses 5582 will have an at least approximately Gaussian shape, too. This will be explained in more detail further below with reference to FIG. 45.

If the pitches $p_1, p_2, \ldots, p_n$ vary within a small range, for example between 48 μm and 50 μm, the deviations from a rectangular angular distribution are small. Even small variations of the pitches $p_1, p_2, \ldots, p_n$ suffice to introduce a pseudo-random irregularity that reduces undesired interactions between the first scattering plate and the first integrator member 561.

By carefully selecting the height of the center of curvatures, it is possible to influence also diffractive effects that become present if the pitch $p_1, p_2, \ldots, p_n$ is very small, for example smaller than 50 μm at a wavelength λ=193 nm. In such configurations the scattering function of the first scattering plate 558 is therefore a combination of refractive and diffractive effects that may both be selectively determined by selecting the aforementioned design parameters.

Since the array of microlenses 5582 is not strictly periodic, it does not produce significant Talbot interference patterns, or the contrast of the Talbot interference patterns is significantly reduced. This results in a more homogenous intensity distribution in the mask plane 70.

Figure 27:
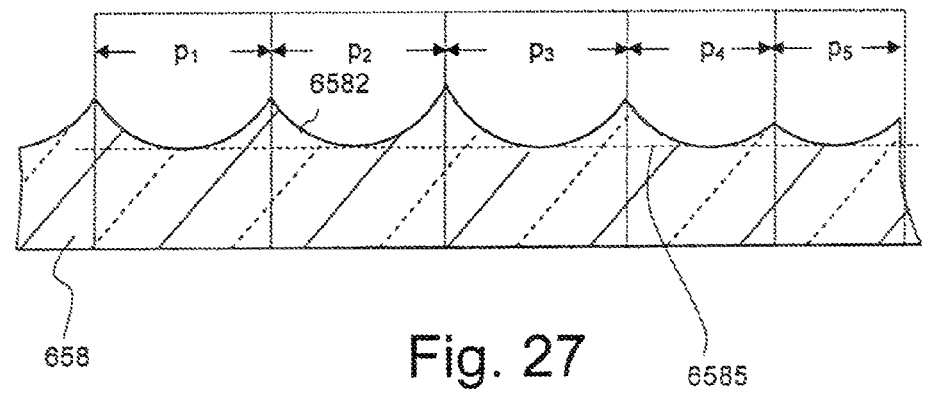

FIG. 27 shows a cross-section through another first scattering plate 658 that also includes concave microlenses 6582 having varying pitches $p_1, p_2, \ldots, p_n$—In contrast to t FIG. 26, the vertex lines of the micro lenses 6582 and not the longitudinal edges between adjacent microlenses are arranged in a common plane 6685 that is parallel to a base plane of the first scattering plate 658. This has the effect that the longitudinal edges between adjacent microlenses 6582 are arranged at different heights from the base plane, and thus the microlenses 6582 are generally not symmetrically shaped with respect to their vertex lines. As a result, the microlenses 6582 produce asymmetrical angular distributions. However, if the number of microlenses 6582 is sufficiently large, a highly symmetrical angular distribution will nevertheless be obtained.

The pitch variation has the effect of reducing undesired interactions between the first scattering plate and the first integrator member 561, and in particular of reducing the contrast of Talbot interference patterns.

Figure 28:
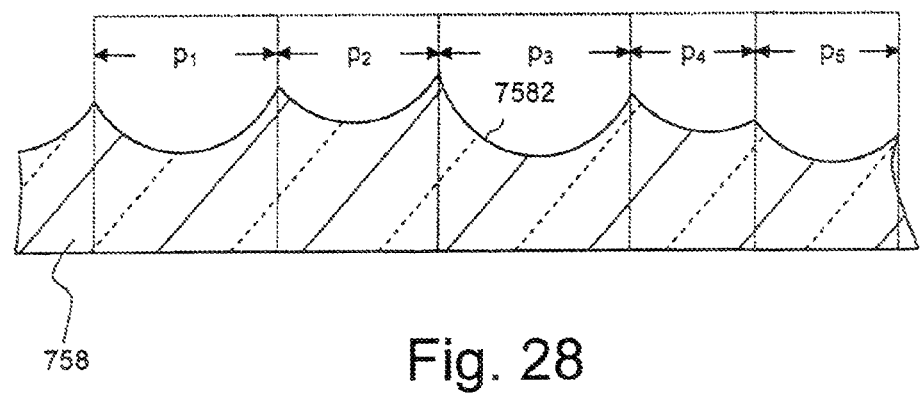

FIG. 28 shows a section through a first scattering plate 758 that also includes concave microlenses 7582 having varying pitches $p_1, p_2, \ldots, p_n$. In contrast to FIGS. 26 and 27, however, neither the vertices of the micro lenses 7582 nor the longitudinal edges between adjacent microlenses 7582 are arranged in a common plane. This further increases the pseudo-random irregularity of the scattering plate 758, which has an advantageous effect in view of undesired interactions with the first integrator member 561.

Figure 29:
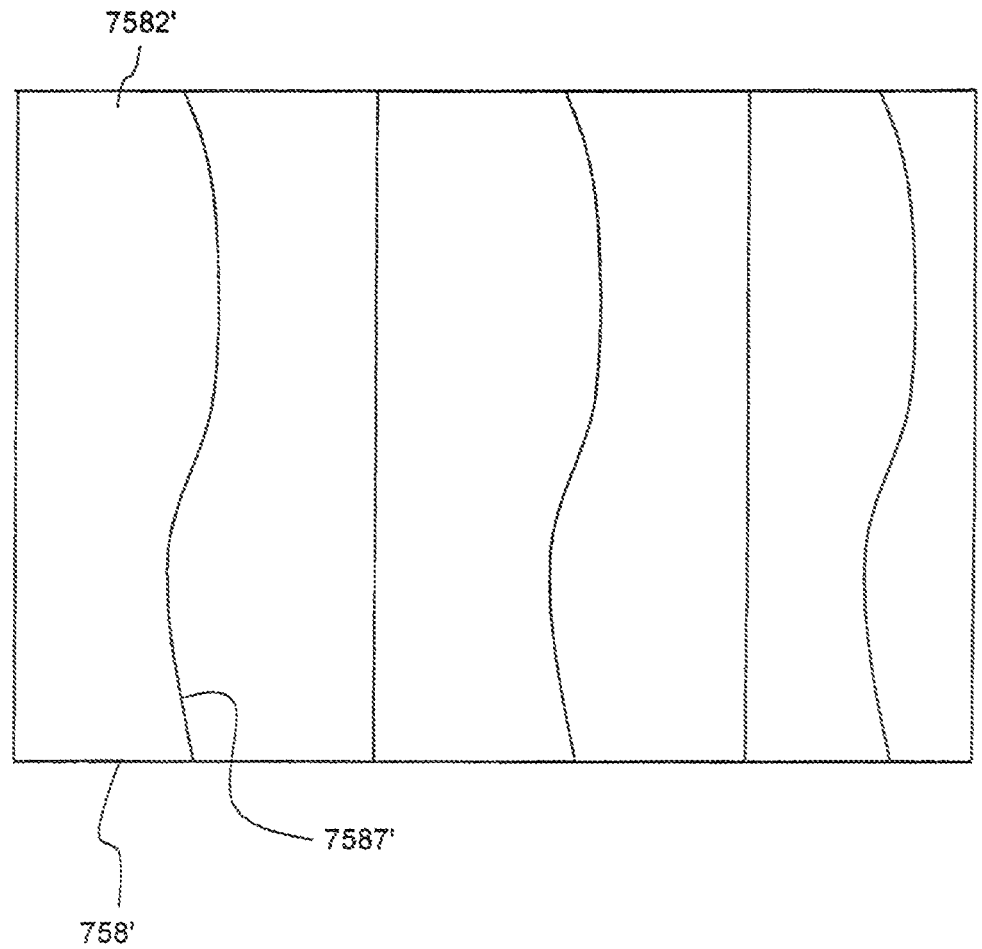
FIG. 29 is a top view of an embodiment having microlenses with varying widths.

The pseudo-random irregularity may be still further increased by providing microlenses 7582' having varying widths along their longitudinal axes. FIG. 29 shows a top view on a first scattering plate 758' that exploits this principle. Here every second edge 7587' between adjacent microlenses 7582' is curved in a pseudo-randomly manner so that the pitch of each microlens 7582' varies in the Y direction. This principle may be employed in any of FIGS. 21 to 28. In the scattering plate 758' the edges 7587' have all, in the top view shown, the same shape. However, even this shape may be different for each microlens 7582'. Of course it is also possible to have curved edges 7587' between each arbitrary pair of microlenses 7582'.

Figure 30:
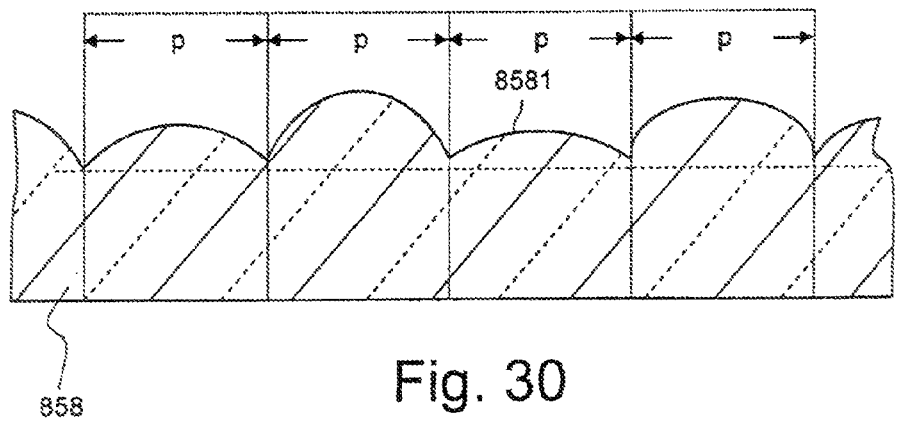
FIGS. 30 to 32 show embodiments of a first scattering plate in sectional views similar to FIG. 22.

FIG. 30 shows a cross-section through a scattering plate 858 including a plurality of convex cylindrical microlenses 8581. All microlenses 8581 have the same pitch p, but the curved surfaces of the microlenses 8581 have different non-circular cross-sections. For illustrative reasons the differences are exaggerated in FIG. 30. In order to introduce an irregularity in the microlens array, smaller differences between the curved surfaces of the microlenses 8581 may suffice.

Similar to shown in FIGS. 26 to 29, the angular distributions produced by the first scattering plate 858 are not perfectly rectangular, but have slopes at the edges. However, using cylindrical microlenses having a non-circular cross-section considerably enlarges the design freedom. By carefully designing the curved surfaces of the microlenses 8581 it is possible to produce almost any arbitrary angular distribution, to produce desired non-uniformities in the irradiance distribution in the mask plane 70, or to compensate for effects that would otherwise produce undesired non-uniformities in the irradiance distribution in the mask plane 70.

Figure 31:
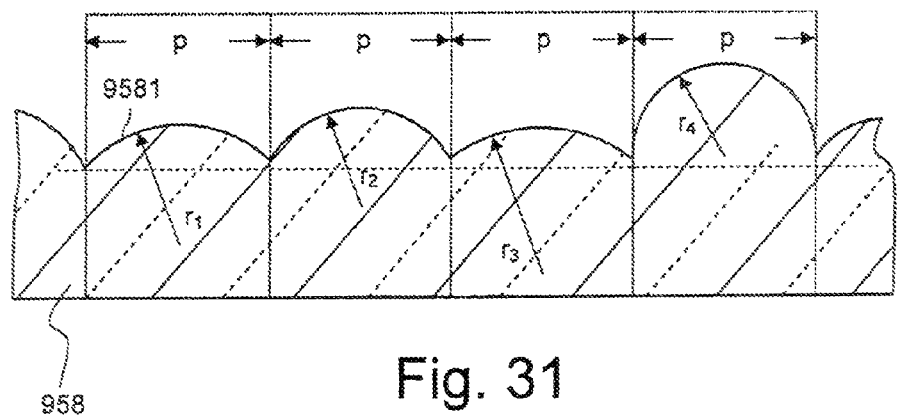

FIG. 31 shows a cross-section through a first scattering plate 958 including a plurality of convex cylindrical microlenses 9581. The first scattering plate 958 differs from FIG. 30 in that the microlenses 9581 have different curved surfaces, too, but all these surfaces have circular cross-sections with different radii $r_1, r_2, \ldots, r_n$.

In view of obtaining an approximately rectangular angular distribution, it may be advantageous in both embodiments shown in FIGS. 30 and 31 to combine the surface shape variation with a pitch variation that has been explained above in connection with the embodiments shown in FIGS. 26 to 28.

Figure 32:
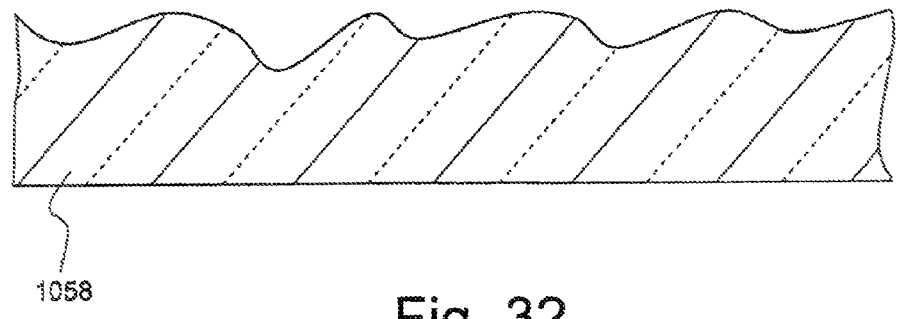

FIG. 32 shows a section through a first scattering plate 1058 that has a completely randomized surface. Such a surface may be obtained with certain manufacturing processes that involve stochastic process steps. For example, by grinding and/or etching glass screens the surface shape obtained in this process cannot be controlled up to the very detail, and it will therefore vary randomly, at least within certain limits. However, the angular distribution generated by such a completely random surface is always at least substantially Gaussian, which restricts the use of such a first scattering plate 1058 to applications in which a Gaussian distribution is desired. Furthermore, the parameters of the Gaussian distribution are often difficult to control in the manufacturing process.

Therefore it is also envisaged to use microlithographic methods to produce a two-dimensional pseudo-random surface that produces a Gaussian angular distribution as they are produced by random surfaces obtained with manufacturing processes involving stochastic process steps. The advantage of such surfaces is that the parameters of the Gaussian distribution can be exactly predicted so that all manufactured scattering plate have identical optical properties.

Figure 33:
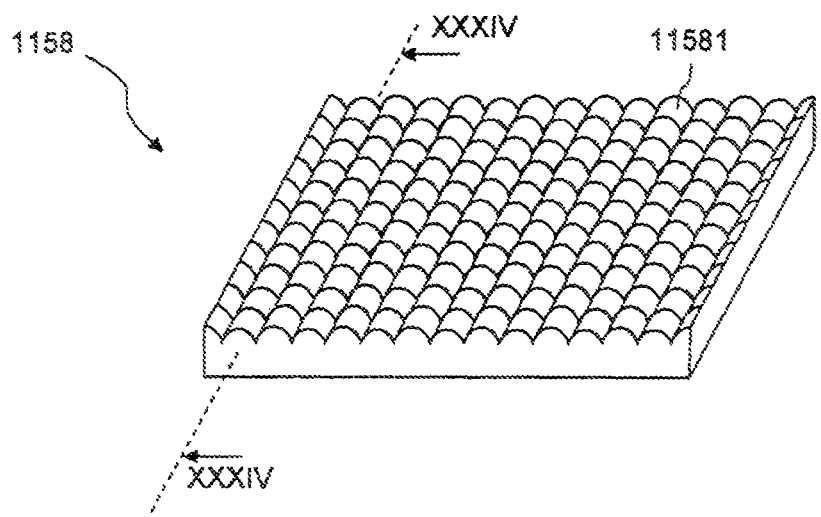
FIG. 33 is a perspective view of a first scattering plate according to an embodiment.
Figure 34:
FIG. 34 is a section through the first scattering plate shown in FIG. 33 along line XXXIV-XXXIV.

FIGS. 33 and 34 show a first scattering plate 1158 in a perspective view and a section along line XXXIV-XXXIV, respectively. The first scattering plate 1158 includes a plurality of microlenses 11581 each having a toric shape.

The curvature of the toric microlenses 11581 is, in the embodiment shown, larger in the X-Z plane than in the Y-Z plane. This ensures that the divergence produced in the X direction is greater than the divergence produced in the Y direction. With the use of toric microlenses 11581 there is no need to provide microlenses on both sides of the scattering plate if a divergence shall be produced both in the X and in the Y direction.

Figure 35:
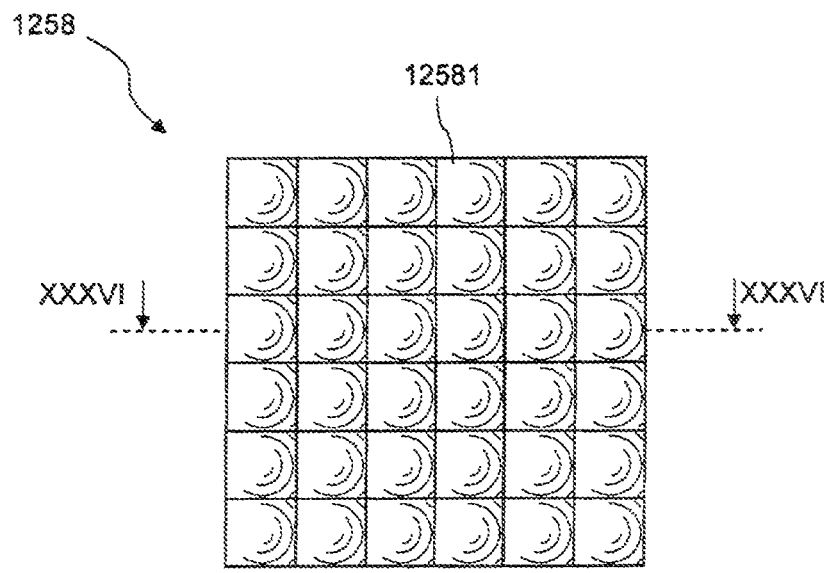
FIG. 35 is a top view of a first scattering plate including a plurality of rotationally symmetric microlenses.
Figure 36:
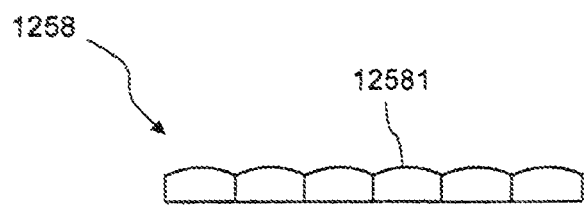
FIG. 36 is a section through the first scattering plate shown in FIG. 35 along line XXXVI-XXXVI.

FIGS. 35 and 36 show a first scattering plate 1258 in a top view and a sectional view along line XXXVI-XXXVI. The first scattering plate 1258 includes a plurality of convex spherical microlenses 12581 that are arranged in a regular grid-like array. Depending on the desired angular distribution embodiments with aspherical microlenses may be used. Each microlens 12581 has a quadratic circumference so that the optical effect of the micro lenses 12581 is not completely rotationally symmetric. Instead, the angular distribution has a fourfold symmetry. The first scattering plate 1258 is suitable only for those applications in which a more or less rotationally symmetric angular distribution is desired. However, such a design is particularly advantageous for the second scattering plate 60, as will be explained further below.

4.3.5 Diffractive Designs

In the following various embodiments will be described with reference to FIGS. 37 to 43 in which the first scattering plate 58 includes diffractive optical structures. These diffractive structures increase the divergence in at least one direction. In the following a group of diffractive structures that produces a substantially complete angular distribution will be referred to as diffractive cell. A single diffractive cell therefore corresponds to a microlens of the refractive designs described in section 4.3.4.

Diffractive scattering plates make it possible to produce almost any arbitrary angular distribution. However, the angular distribution produced by a diffractive cell is always discrete, whereas the angular distributions produced by smoothly curved refractive surface is continuous. The smaller the cell is, the more discrete is the produced angular distribution, and vice versa.

FIG. 37 shows a top view of a diffractive cell M1 containing a plurality of diffractive structures 92. This type of diffractive cell is often referred to as computer generated hologram (CGH) and produces a predefined angular distribution in at least one direction.

Figure 39A:
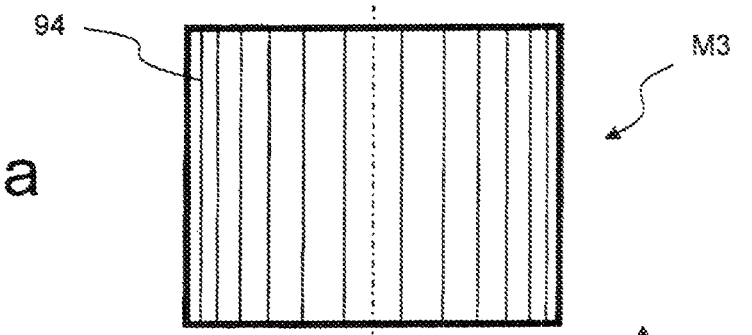
FIGS. 39a and 39b are top views on diffractive cells forming cylinder lenses having different lateral positions.
Figure 39B:
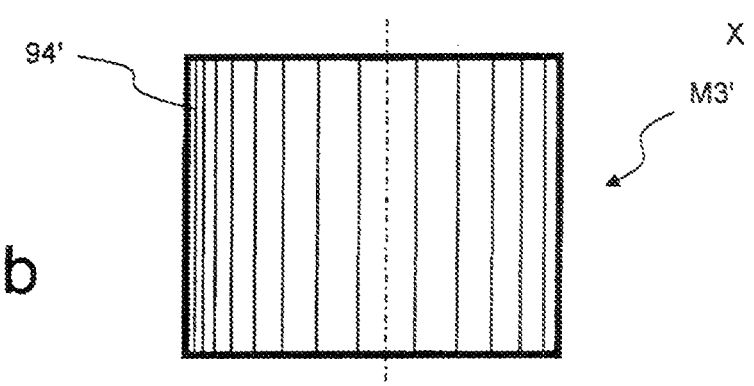

FIG. 38a shows another cell M2 containing diffractive structures 93 that form a Fresnel lens that is, at least substantially, rotationally symmetric. FIG. 39a shows a top view on a diffractive cell M3 containing diffractive structures 94 that form a cylindrical Fresnel lens.

If diffractive cells M are arranged in a strictly periodic array, the undesired interactions between the first scattering plate 58 and the optical integrator 56 may arise that have been explained above in section 4.2. For that reason the array of the diffractive cells M should be randomized, at least to a certain extent, and/or a suitable pitch selection as explained in section 4.3.2 should be made.

FIG. 40 shows a schematic top view of a first scattering plate 1358 including a plurality of diffractive cells M that are arranged in a periodic grid-like manner. It is assumed that the diffractive cells M scatter light only in the X direction. In this direction the pitch p of the diffractive cells M should be selected in accordance with the principles explained in section 4.3.2 above in order to avoid frequent correlations between the diffractive cells M on the one hand and the microlenses of the first integrator member 561 on the other hand.

FIG. 41 shows a schematic top view of a first scattering plate 1458 including a plurality of diffractive cells M. In this embodiment the pitch p of the diffractive cells M varies along the X direction in which the divergence is increased. The effect of smaller diffractive cells M depends on the kind of diffractive structures contained therein. For example, if the diffractive cell M3 shown in FIG. 39a is reduced in its length without altering the arrangement of the diffractive structures 94, it will produce a smaller angular distribution. If the length in the X direction of the diffractive cell M1 shown in FIG. 37 is reduced, the angular distribution will have the same width, but the distribution will become more discrete.

FIG. 42 shows a schematic top view of a first scattering plate 1558 in which the pitch of the diffractive cells M varies differently in each row. This further increases the pseudo-random irregularity of the angular distribution produced by the entirety of diffractive cells M.

Figure 43:

FIG. 43 shows in a schematic top view a first scattering plate 1658 that includes a plurality of diffractive cells $M_1$, $M_2$, ..., $M_6$ having equal pitches. Thus the cells $M_1$, $M_2$, ..., $M_6$ are arranged in a regular manner similar to the embodiment shown in FIG. 40. However, in this embodiment the diffractive cells, $M_1$, $M_2$, ..., $M_6$ differ from each other as far as the arrangement of diffractive structures contained therein is concerned. This is comparable to the refractive scattering plates 858 and 958 shown in FIGS. 30 and 31, respectively.

The different cell structures may be obtained by scaling up or down a given cell structure. This corresponds to an increase or decrease of the radii ri in the refractive scattering plate 958 shown in FIG. 31. For a diffractive structure an example of this scaling transformation is shown in FIG. 38b. In the diffractive cell MT the diffractive structures 93' are obtained by scaling up the diffractive structures 93 of the diffractive cell M2 shown in FIG. 38a.

Another approach to obtain different cell structures is to shift a given cell structure along the direction in which a scattering effect shall be achieved. This is exemplarily illustrated in FIG. 39b. Here the diffractive cell M3' is obtained from the diffractive cell M3 shown in FIG. 39a by shifting the diffractive structures 94 along the X direction. This is a similar effect as it is achieved in the refractive scattering plate 658 shown in FIG. 27.

It should be noted that the proposed variations with respect to cell pitch and cell structure will usually affect the angular distribution. However, this may be taken into account in the design of the diffractive cells M so that a desired angular distribution is obtained with a pseudo-randomized array of diffractive cells.

As a matter of course, some or all variations, in particular with respect to the cell pitch p and the cell contents, may be combined to further increase the random nature of the first scattering plate 58 which avoids undesirable interactions with the first integrator member 561.

5 Second Scattering Plate

In the following the general function and various embodiments for the second scattering plate 60 will be explained in more detail.

5.1 General Function of Second Scattering Plate

The second scattering plate 60 may have one or more of the following functions:

One function of the second scattering plate 60 may be to ensure that the irradiance distribution in the mask plane 70 along the Y direction has the desired shape. This can involve adapting the angular distribution, which the second scattering plate 60 as such produces along the Y direction, to the angular distributions along this direction produced by the first scattering plate 58 (if any) and the optical integrator 56.

If the irradiance distribution along the Y direction (i.e. scan direction) is rectangular, undesired feature size variations may occur as a result of the pulse-quantization. For reducing or even completely avoiding the pulse-quantization effect, which is described in more detail in International Application WO 2005/078522 mentioned above, the irradiance should smoothly increase and decrease at both ends of the irradiance distribution. The slope may be linear, which results in an overall trapezoidal shape of the irradiance distribution, or may have a substantially Gaussian shape, for example.

Another function of the second scattering plate 60 may be to avoid undesired correlations between the light bundles produced by the secondary light sources 82. This implies that adverse effects caused by diffraction in the second integrator member 562 on the irradiance distribution are reduced.

A still further function of the second scattering plate 60 may be to improve the angular distribution of the light as it traverses the mask plane 70. To this end it is preferred to arrange the second scattering plate 60 between the optical integrator 56 and the condenser 62. In this position the second scattering plate 60 is arranged at some distance from the pupil plane 54 so that a blurring effect for the secondary light sources can be achieved. Preferably the secondary light sources are enlarged by the blurring effect to such an extent that adjacent secondary light sources about or even overlap in the pupil plane 54. As a result, it is possible to obtain a continuous angular distribution in the mask plane 70 that may be advantageous for certain illumination settings.

The second scattering plate 60 may further have an advantageous effect on the telecentricity and ellipticity properties of the illumination system 12.

Similarly to the first scattering plate 58, the second scattering plate 60 should have the property that the dimensions of the substructures producing the angular distribution is small, preferably smaller than 20% of the pitch of the microlenses of the optical integrator 56.

In the following it is assumed that the desired irradiance distribution along the Y direction has a Gaussian shape with a half value width that ensures the desired aspect ratio of the illuminated field 14. As has been mentioned before, such a shape of the irradiance distribution is advantageous in view of a reduction of the pulse quantization effect. It is possible to produce such a irradiance distribution mainly with a combination of the optical integrator 56 and the scattering plates 58, 60. This means that there is no need to block out light, for example using gradient absorption filter elements. Possible realizations how a Gaussian irradiance distribution along the Y direction may be obtained will be explained below with reference to the embodiments described in section 5.2.

Enlarging the secondary light sources both in the X and the Y direction involves, however, that the second scattering plate 60 also increases the divergence in the X direction. This is as such undesirable because it results in a non-rectangular irradiance distribution in the X direction, i.e. perpendicular to the scan direction. Smooth slopes at the lateral edges of the irradiance distribution along the X direction have to be blocked out, for example using the field stop 66. If the light losses shall be kept small, the second scattering plate 60 has to have an anamorphic scattering effect similar to the first scattering plate 58. Since such a second scattering plate 60 does not enlarge the secondary light sources in the X direction, a tradeoff has to be found between having a substantially continuous angular distribution in the mask plane 70 on the one hand and small light losses on the other hand.

Figure 44:
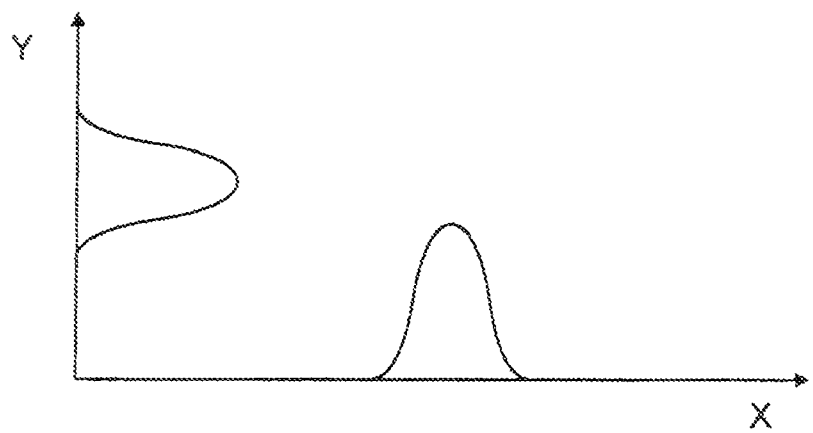
FIG. 44 is a graph illustrating the angular distribution produced by the second scattering plate.

Here it is assumed that the secondary light sources shall be increased both in the X and Y direction. To this end the second scattering plate 60 produces an angular distribution that is rotationally symmetrical and has a Gaussian shape, as is illustrated in FIG. 44.

5.2 Different Design Approaches

In the following different design approaches for the second scattering plate 60 will be explained with reference to FIGS. 45 to 49.

In principle the second scattering plate may be realized using a refractive design, a diffractive design or a design combining refractive and diffractive effects. For that reason all designs that have been described above in section 4.3.1 in connection with the first scattering plate 58 may equally be used for the second scattering plate 60. However, refractive designs are generally more preferred for the second scattering plate 60. This is because diffractive optical elements usually cause, as a result of their limited diffraction efficiency, higher light losses than refractive optical elements. The following remarks relate to refractive designs, but they also apply to diffractive remarks if the microlenses are replaced by appropriate diffractive cells.

If a two-dimensional angular distribution shall be produced as shown in FIG. 44, the following approaches should be contemplated:

5.2.1 Two Microlens Arrays on Different Sides

A two-dimensional angular distribution can be obtained, as has been explained further above, by arranging a first array of parallel microlenses on one side of a substrate and a second array of perpendicular micro lenses on the other side. Alternatively, the array may be formed on two distinct substrates. In both cases it is possible to determine the scattering effect for each direction completely independent from one another by carefully selecting the design parameter of each array.

Figure 45:
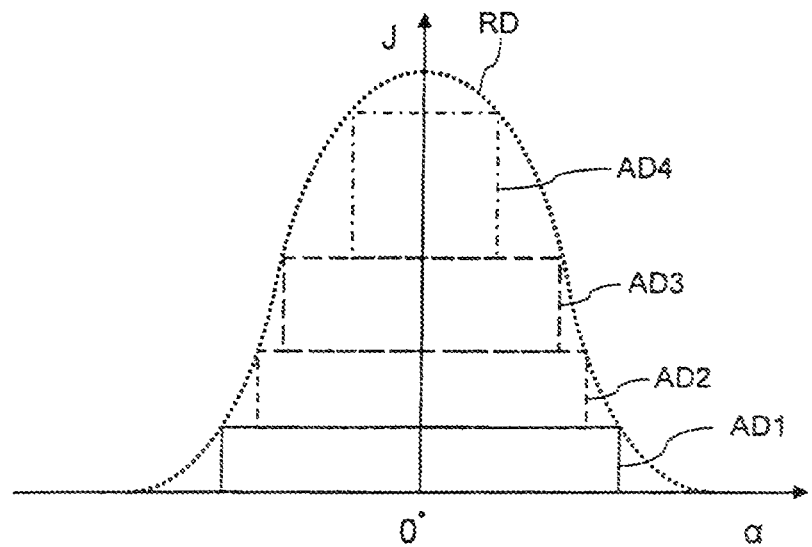
FIG. 45 is a graph illustrating the formation of a Gaussian angular distribution by superposing rectangular distributions of different widths.

For generating a Gaussian angular distribution an approximation may be used that will now be explained with reference to FIG. 45. Here the second scattering plate 60 includes a plurality of microlenses that produce rectangular angular distributions of different angular widths. The angular widths vary with a Gaussian probability distribution around a center angle $\alpha_o=0°$. The superposition of all rectangular angular distributions having different widths then results in an overall angular distribution having a Gaussian shape. This is illustrated in FIG. 45 for four different rectangular angular distributions AD1, AD2, AD3 and AD4. The larger the number of microlenses is, the better is the approximation to a Gaussian angular distribution.

In order to further smooth the stepped profile shown in FIG. 45 along the scan direction, it may be advantageous to deviate from the orthogonal orientation of the two arrays of microlenses. For example, the microlenses on both sides may form an angle between 89° and 80°.

If the arrays of microlenses are arranged on different substrates, the substrates may be arranged such that one or both substrates can be rotated around an axis coaxial or at least parallel to the optical axis 26 with the help of a manipulator. Then it is possible to adjust the angle between the microlens arrays.

A deviation of the two microlens array orientations from 90° has the effect that one array produces an angular distribution having a portion along the direction of the other array. This portions results in a smoothing effect. Mathematically speaking, the result is a convolution of the stepped profile as shown in FIG. 45 with a projection of this profile. The actual width of the projection depends on the angle between the two microlens array orientations and it is proportional to the cosine of this angle. Thus, if the orientation angle is chosen such that the profile projection width is comparable to the step width, the convolution has a considerable smoothing effect.

It may also be considered to arrange the microlens arrays such that they are not aligned parallel to the scan direction. If the microlenses produce angular distributions having small ripples, and these ripples are aligned parallel to the scan direction, the total light energy (dose) impinging on a single point on the mask will vary accordingly. If, however, no microlens array is aligned parallel to the scan direction, the ripples in the irradiance distribution are also inclined with respect to the scan direction. The scanning motion then results in an averaging effect over many ripples, which has the effect of a constant total light energy (dose) received by each point on the mask.

Apart from that, a configuration in which no array is aligned parallel to the scan direction has the advantage that undesired Moire patterns are reduced that may otherwise occur as an interaction with the regular microlens arrays of the optical integrator 56.

If both arrays are arranged on one substrate, this may be rotated accordingly in order to avoid a parallel orientation of a microlens array with respect to the scan direction. If both arrays are arranged on different substrates, it may suffice to rotate only one substrate. In order to maintain the relative angle between the arrays, however, both substrates may be commonly rotated.

If no adjustment of the angular positions of the microlens arrays is desired, there is no need for manipulators. In these cases the substrate (s) may be fixedly received in mounts that ensure the desired angular positions or the microlens arrays.

5.2.2 Two Crossed Microlens Arrays on One Side

If two arrays of cylindrical microlenses are crossed on one side of a substrate, this results in configurations similar to what has been described above for the first scattering plate 1158 with reference to FIGS. 33 to 34. The microlenses 11581 shown in this embodiment have a toric surface, but a surface obtained by crossing two cylindrical surfaces may also be used.

As a matter of course, also in this case a non-orthogonal orientation of the cylindrical lenses may be considered.

5.2.3 Rotationally Symmetric Profile

As a further alternative, rotationally symmetrical microlenses such as shown in FIGS. 35 and 36 may be used. Also in this embodiment the radii of the microlenses should vary according to the Gaussian probability distribution in order to obtain the Gaussian overall angular distribution shown in FIGS. 44 and 45. Other lens parameters, e.g. center of curvature or refractive index, may additionally or alternatively be varied.

5.3 Other Design Aspects

In the following other advantageous design aspects for the second scattering plate 60 are described with reference to FIGS. 46 to 49.

Figure 46:
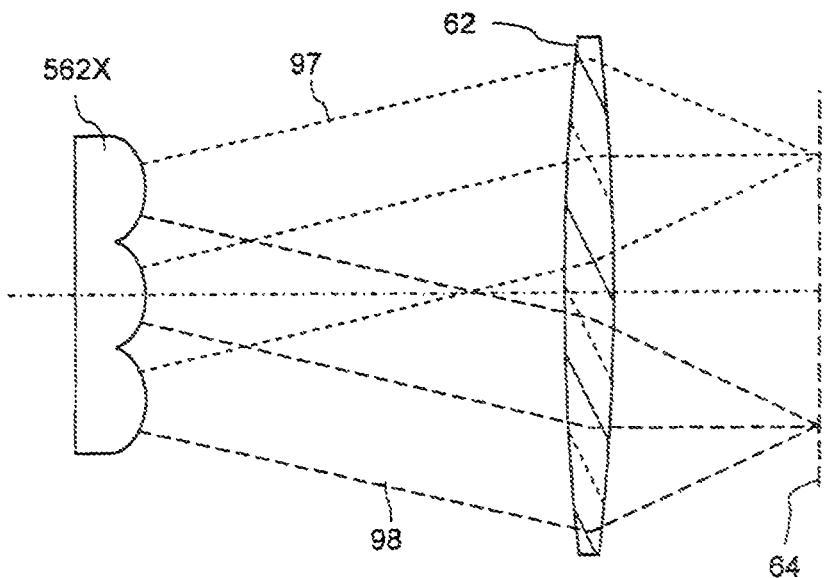
FIGS. 46 and 47 are schematic views of a part of the optical integrator and the condenser contained in the illumination system shown in FIG. 2 without and with the second scattering plate, respectively.

FIG. 46 shows, in a highly schematic representation that is not to scale, three third microlenses 562X, the condenser 62 and the field stop plane 64. Two groups of broken lines 97, 98 indicate ray bundles each leaving the third micro lenses 562X under the same aperture angle and consequently converge to the same field point in the field stop plane 64. The higher the number of third microlenses 562X is, the more rays 97, 98 will contribute to the irradiance in the field stop plane 64 under different angles. However, there will not be a completely continuous angle distribution in the field stop plane 64 due to the restricted number of third microlenses 562X. The same applies, of course, for the Y direction.

Figure 47:
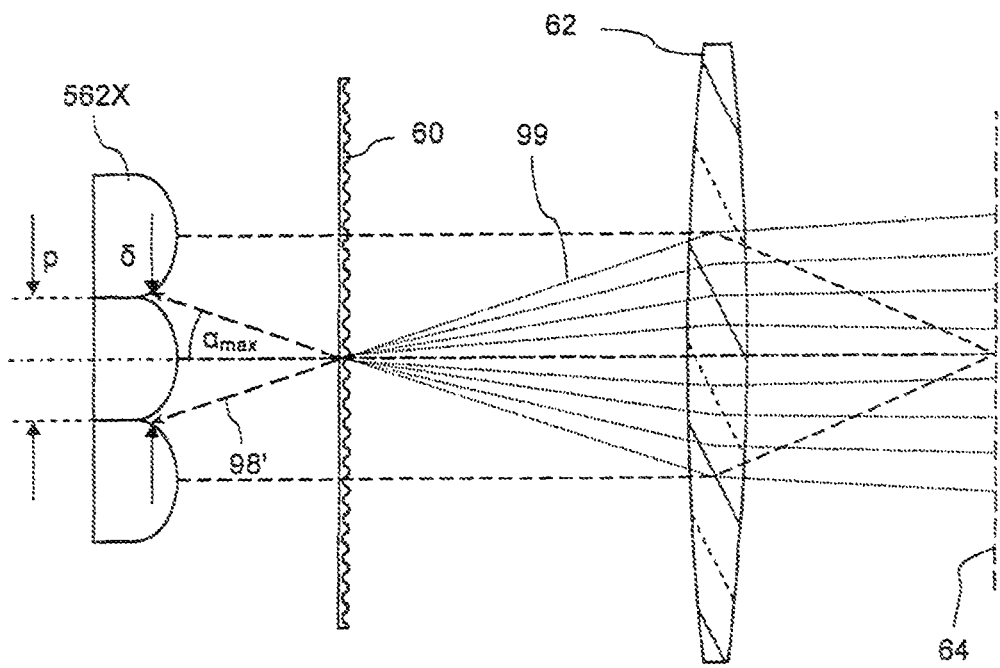

FIG. A1 shows the same configuration, but now with the additional second scattering plate 60 arranged between the optical integrator 56 and the condenser 62. The second scattering plate 60 produces a continuous angular distribution which is indicated in FIG. 47 by a plurality of scattered light rays 99. Preferably the maximum scattering angle $\alpha_{max}$ is determined such that scattered light rays 99' having a maximum scattering angle $\alpha_{max}$ would, if extended backwards towards the third microlenses 562X, impinge on the third micro lenses 562X at a distance $\delta$ that is at least as large as the pitch p of the third micro lenses 562X.

If looked at from the field stop plane 64, it then seems that the projection light impinging on the field stop plane 64 is produced by secondary light sources 82' that have an extension in the X direction which is at least as large as the pitch p of the third microlenses 562X. In other words, the secondary light sources then abut or even overlap in the pupil plane 54 in the X direction. Of course the same considerations apply also for the Y direction.

As a result of the abutting or overlapping secondary light sources, the projection light impinges on any point in the field stop plane 64 with a continuous range of illumination angles, wherein the range is determined by the illumination setting.

Ideally the irradiance distribution in the pupil plane 54 is homogeneous. This property may be achieved with the help of the second scattering plate as well, as will be explained with reference to FIGS. 48 and 49.

Figure 48:
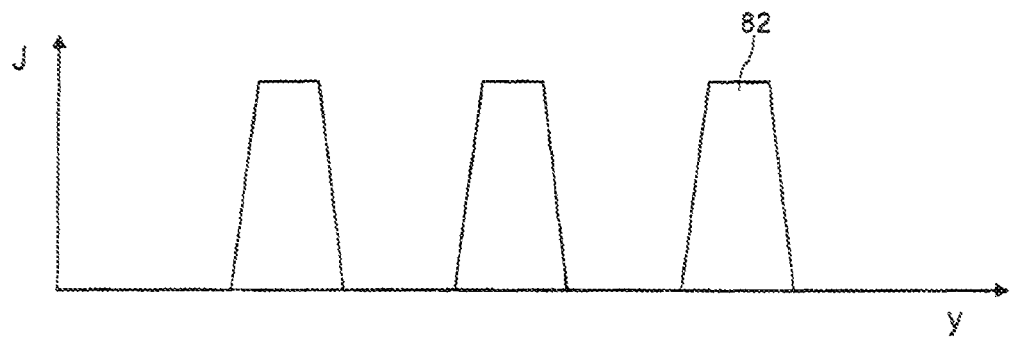
FIG. 48 is a graph showing an exemplary intensity distribution in the pupil plane of the illumination system shown in FIG. 2, but without the second scattering plate.

FIG. 48 shows a graph in which the intensity distribution J in the pupil plane 54 is plotted against the Y direction for three adjacent secondary light sources 82. In the schematic representation the secondary light sources 82 are, for the sake of simplicity, characterized by trapezoidal intensity distributions. Between these distributions gaps remain through which no light passes.

However, by carefully designing the scattering properties of the second scattering plate 60 it is possible to effectively broaden the secondary light sources 82 such that the half value widths of the intensity distribution of each single secondary light source 82 meet.

Figure 49:
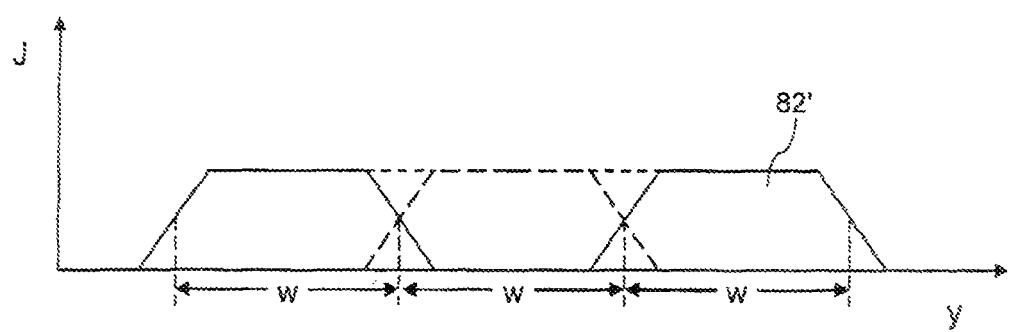
FIG. 49 shows the intensity distribution of FIG. 48, but with the second scattering plate inserted.

What this means is shown in FIG. 49. Here it is, again for the sake of simplicity, assumed that the second scattering plate 60 effectively broadens the intensity distributions of the secondary light sources 82 in the pupil plane, but retains their trapezoidal shape. The intensity distributions are broadened to such an extent that the half value widths w of adjacent intensity distributions 82' abut. The overlapping intensity distributions 82' then homogeneously illuminate the pupil plane 54, and all illumination angles are present with the same intensity between 0° and the maximum angle $\alpha_{max}$ which is determined by the diameter of the pupil. Of course this holds true, in a strict sense, only in the case of a conventional illumination setting with maximum σ. In the case of other illumination settings, the completely and homogeneously illuminated areas are defined by the setting.

Therefore the angular distribution may be defined solely with those members that are provided for achieving different illumination settings. In the illumination system 12 these include the first optical raster element 34, the zoom lens group 46 and the pair 48 of axicon elements. The optical integrator 56 and the scattering plates 58, 60 thus ensure that no other parameters have to be considered in defining the angular distribution in the mask plane 70 other than the intensity distribution in the pupil plane 54 defined by those members.

If the illumination system 12 includes three optical elements that increase the geometrical optical flux, namely the optical integrator 56 and the two scattering plates 58, 60, it has to be considered how the increase is distributed among these three optical elements. In this respect it has been found advantageous to define the maximum divergence produced by the first scattering plate 58, the optical integrator 56 and the second scattering plate 60 in the following way:

$$NA1X \leq NA2X,$$

$$NA2X > 5 \cdot NA2Y,$$

$$0.9 \cdot NA3Y < NA3X < 1.1 \cdot NA3Y.$$

where NA1X is the maximum divergence angle produced by the first scattering plate 58, NA2X and NA2Y are the maximum divergence angles produced by the optical integrator 56 and NA3X, NA3Y are the maximum divergence angles produced by the second scattering plate 60 for the X and Y directions, respectively.

The invention claimed is:

1. An optical system, comprising:
a light source;
an optical integrator comprising a plurality of first optical subelements, the optical integrator being configured to produce a plurality of secondary light sources each emitting a light bundle during use of the optical system;
a condenser configured to effect a superposition of the light bundles in a field plane during use of the optical system;
a first scattering structure comprising a plurality of second optical subelements, the first scattering structure being before the optical integrator in a light propagation direction of the optical system, each second optical subelement being configured to produce a substantially rectangular angular light distribution during use of the optical system; and
a second scattering structure between the optical integrator and the condenser along the light propagation direction of the optical system,
wherein the optical system is a micro lithographic illumination system.

2. The optical system of claim 1, wherein the optical integrator comprises a fly-eye integrator comprising first and second integrator members, and each of the first and second integrator members comprises a plurality of the first focusing optical subelements.

3. The optical system of claim 2, wherein each of the second optical subelements is configured so that, during use of the optical system, each of the second optical subelements produces an angular light distribution that suffices to completely illuminate, together with the first optical subelements of the first integrator member, first optical subelements of the second integrator member.

4. The optical system of claim 1, wherein the second optical subelements are arranged in a periodic array.

5. The optical system of claim 1, wherein, in a direction perpendicular to an optical axis of the optical system, the first optical subelements have a first pitch and the second optical subelements have a second pitch different from the first pitch.

6. The optical system of claim 5, wherein the second optical subelements are arranged in a periodic array, and the first pitch is prime to the second pitch.

7. The optical system of claim 1, wherein the second scattering structure comprises optical subelements arranged in a non-periodic array.

8. The optical system of claim 1, wherein the first optical subelements have, along a direction in which a geometrical optical flux is increased, a first pitch which is less than 1000 μm.

9. The optical system of claim 8, wherein the first pitch is less than 600 μm.

10. The optical system of claim 8, wherein the second optical subelements have, along a direction in which a geometrical optical flux is increased, a second pitch which is less than the first pitch.

11. The optical system of claim 1, wherein each of the second optical subelements comprises a microlens.

12. The optical system of claim 11, wherein at least some of the microlenses have a cylindrical shape.

13. The optical system of claim 1, wherein each of the second optical subelements is configured to produce an anamorphic angular light distribution during use of the optical system so that a geometrical optical flux is increased to different extents in orthogonal directions.

14. The optical system of claim 13, wherein a projection exposure apparatus contains the optical system, the projection exposure apparatus has a scan direction, and the geometrical optical flux is increased along the scan direction of the projection exposure apparatus to a smaller extent than perpendicular to the scan direction.

15. The optical system of claim 14, wherein the geometrical optical flux is not substantially increased along the scan direction of the projection exposure apparatus.

16. The optical system of claim 1, wherein a distance between the first scattering structure and the optical integrator is different from a Talbot distance of the first scattering structure.

17. The optical system of claim 1, wherein the first optical subelements have shapes defined by first borderlines, the second optical subelements have shapes defined by second borderlines, the first and second borderlines form an angle which is greater than 0.1° and less than 89.9°.

18. The optical system of claim 1, wherein the second scattering structure comprises first and second kinds of second optical subelements, the first kind of optical subelements are configured to increase a geometrical optical flux in a first direction during use of the optical system, and the second kind of optical subelements are configured to increase a geometrical optical flux in a second direction different from the first direction.

19. The optical system of claim 18, wherein the optical system is contained in a microlithographic projection exposure apparatus which has a scan direction, and the first kind of optical subelements are configured so that, during use of the optical system, the first kind of optical subelements produce a Gaussian angular light distribution in the scan direction of the microlithographic projection exposure apparatus.

20. The optical system of claim 19, wherein the Gaussian angular light distribution is approximated by a superposition of a plurality of substantially rectangular angular distributions of different width.

21. The optical system of claim 20, wherein the second type of optical subelements are cylindrical microlenses having different pitches.

22. The optical system of claim 18, wherein the optical system is contained in a microlithographic projection exposure apparatus which has a scan direction, and the second kind of optical subelements are configured so that, during use of the optical system, the second kind of optical subelements produce a rectangular angular light distribution perpendicular to the scan direction of the microlithographic projection exposure apparatus.

23. The optical system of claim 18, wherein the first and second kinds of optical subelements, respectively, are on opposite sides of a common support.

24. The optical system of claim 1, wherein the first and second scattering structures are configured to modify the angular distribution during use of the optical system in a way that would be obtained, in the absence of the at least one scattering structure, by enlarging the secondary light sources such that they abut or overlap.

25. An apparatus, comprising:
an optical system according to claim 1,
wherein the apparatus is microlithographic projection exposure apparatus.

* * * * *

UNITED STATES PATENT AND TRADEMARK OFFICE
CERTIFICATE OF CORRECTION

| | | |
|---|---|---|
| PATENT NO. | : 9,217,930 B2 | Page 1 of 1 |
| APPLICATION NO. | : 13/760268 | |
| DATED | : December 22, 2015 | |
| INVENTOR(S) | : Johannes Wangler et al. | |

It is certified that error appears in the above-identified patent and that said Letters Patent is hereby corrected as shown below:

Specification

Col. 6, line 54, delete "fi" and insert -- $f_1$ --.

Col. 6, line 66, delete "fi." and insert -- $f_1$. --.

Col. 11, line 10, delete "NAsc" and insert -- $NA_{SC}$ --.

Col. 11, line 29, delete "ration" and insert -- ratio --.

Col. 11, line 36, delete "fi" and insert -- $f_1$ --.

Col. 13, line 49, delete "$p_{sc}=2/5\hat{}pi_n$," and insert -- $p_{sc}=2/5>pin$, --.

Col. 19, line 60, delete "ri" and insert -- $r_1$ --.

Claims

Col. 24, line 64, Claim 1, delete "micro lithographic" and insert -- microlithographic --.

Signed and Sealed this
Seventeenth Day of May, 2016

Michelle K. Lee
*Director of the United States Patent and Trademark Office*